(12) United States Patent
Ito et al.

(10) Patent No.: US 7,027,335 B2
(45) Date of Patent: Apr. 11, 2006

(54) SEMICONDUCTOR STORAGE DEVICE

(75) Inventors: Mikihiko Ito, Tokyo (JP); Masaru Koyanagi, Kanagawa (JP); Takashi Taira, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 10/720,980

(22) Filed: Nov. 24, 2003

(65) Prior Publication Data

US 2004/0141382 A1  Jul. 22, 2004

(30) Foreign Application Priority Data

Nov. 28, 2002  (JP) .............................. 2002-345655

(51) Int. Cl.
*G11C 7/00* (2006.01)
(52) U.S. Cl. ...................... 365/194; 365/205
(58) Field of Classification Search ................ 365/194, 365/205
See application file for complete search history.

(56) References Cited

U.S. PATENT DOCUMENTS 6,459,627 B1  10/2002  Sakamoto et al.
6,829,189 B1 *  12/2004  Lim et al. .................... 365/205
6,856,563 B1 *  2/2005  Kim et al. .................. 365/194

* cited by examiner

*Primary Examiner*—Huan Hoang
(74) *Attorney, Agent, or Firm*—Hogan & Hartson, L.L.P.

(57) ABSTRACT

A semiconductor storage device comprises a memory cell array including memory cells, and bit lines for transfer of data in the memory cells; an amplifier circuit connected to the bit lines to amplify data in the memory cells; a first switching element connected between the bit lines and the amplifier circuit; a first reference voltage source which applies to the gate of the first switching element a voltage for turning the first switching element ON; a second switching element and a third switching element connected in series between the gate of the first switching element and the first reference voltage source, said second switching element and said third switching element being connected in parallel to each other; a second reference voltage source which applies to the gates of the second and third switching elements a voltage for turning the second and third switching elements ON; and a first timing shift circuit connected between the gate of the third switching element and the second reference voltage source to delay the operation of the third switching element from the operation of the second switching element.

17 Claims, 23 Drawing Sheets

200

SEMICONDUCTOR STORAGE DEVICE

CROSS-REFERENCE TO RELATED APPLICATION

This application is based upon and claims the benefit of priority from the prior Japanese Patent Application No. 2002-345655, filed on Nov. 28, 2002, the entire contents of which are incorporated herein by reference.

BACKGROUND OF THE INVENTION

1. Field of the Invention

The present invention relates to a semiconductor storage device.

2. Related Background Art

Along with the progress of microminiaturization of DRAMs and other semiconductor storage devices, coupling capacitance of bit line pairs is getting greater and greater. Increase of the coupling capacitance invites interference when data stored in the memory cell is amplified. Conventionally, in order to prevent noise caused by the interference, semiconductor storage devices have been configured to disconnect the bit lines from the sense amplifier when amplifying data after reading the data from the memory cell.

FIG. 21 is a circuit diagram of an amplifier circuit 10 provided in a conventional semiconductor storage device. FIG. 21 illustrates a memory cell 11 on the left and a memory cell 12 on the right. One line of a bit line pair BLL/bBLL is connected to the memory cell 11. One line of a bit line pair BLR/bBLR is connected to the memory cell 12. A bit line pair BLS/bBLS is connected to a sense amplifier in the amplifier circuit 10. The bit line pair BLL/bBLL is connected to bit line pair BLS/bBLS via transistors Q9 and Q10. The bit line pair BLR/bBLR is connected to the bit line pair BLS/bBLS via transistors Q11 and Q12.

Transistors Q9 and Q10 are controlled by a control signal ΦL, and transistors Q12 and Q11 are controlled by a control signal ΦR. If the memory cell 11 has been selected, transistors Q12 and Q11 are switched OFF. As a result, the bit line pair BLS/bBLS is disconnected from the bit line pair BLR/bBLR. If the memory cell 12 has been selected, transistors Q9 and Q10 are switched OFF. As a result, the bit line pair BLS/bBLS is disconnected from the bit line pair BLL/bBLL. Disconnection of the bit line pair BLS/bBLS from the bit line pair BLR/bBLR or BLL/bBLL results in isolating the capacitance of the bit line pair BLR/bBLR or BLL/bBLL in the memory cell array CA from the bit line pair BLS/bBLS in the amplifier circuit 10.

A precharge circuit 15 in the amplifier circuit 10 precharges the respective bit line pairs BLL/bBLL, BLR/bBLR and BLS/bBLS to Vref before the memory cell 11 or 12 is selected. The sense amplifier amplifies data from the memory cell 11 or 12.

FIG. 22 is a circuit diagram of a control circuit 20 that applies the control signal ΦL to the amplifier circuit 10 shown in FIG. 21. The control circuit 20 can output one of voltage values Vpp, Vdd, Vii or Vss.

A boost signal BOOST-L turns a P-channel transistor Q39 ON and can thereby raise the voltage of the control signal ΦL to Vpp. Vpp is a voltage value of the control signal ΦL, which renders the transistors Q9 and Q10 a higher drive power state, and it is higher than Vdd.

An isolating signal bISO-L turns a P-channel transistor Q35 On via a NAND gate G14, and can thereby adjust the voltage of the control signal ΦL to Vdd. Vdd is a voltage value of the control signal ΦL during the precharge of the bit line pairs BLL/bBLL, BLR/bBLR and BLS/bBLS.

In addition, the isolation signal bISO-L turns an N-channel transistor Q36 ON via a NOR gate G16, and can thereby adjust the voltage of the control signal ΦL to Vii. Vii is a voltage value that turns the transistors Q9 and Q10 OFF. Vii is higher than Vss and lower than Vdd.

A select signal SEL-R turns an N-channel transistor Q34 ON and can thereby adjust the control signal ΦL to Vss. Vss is the ground voltage. In addition, the select signal SEL-R controls a switch composed of a P-channel transistor Q31 and an N-channel transistor Q32. Thereby, a signal bBOOST-L, which is the inverted signal of the boost signal BOOST-L, is input to the NAND gate 14, and the boost signal BOOST-L is input to the NOR gate G16. The select signal SEL-R is HIGH when selecting the memory cell 12 shown in FIG. 21, and LOW when selecting the memory cell 11 shown in FIG. 21.

FIG. 23 is timing chart that shows operations of amplifier circuit 10 shown in FIG. 21 and the control circuit 20 shown in FIG. 22. With reference to FIG. 23, performance of the amplifier circuit 10 when amplifying data of the memory cell 11 will be explained. Before the amplifier circuit 10 reads out data, voltage of the control signal ΦL and ΦR are Vdd. Therefore, transistors Q9, Q10, Q12 and Q11 are ON.

First, the precharge signal EQ is set LOW to turn the precharge circuit 15 OFF (point of time to). At this time, in response to the control signal ΦR being set to Vss, the transistors Q11 and Q12 are turned OFF. As a result, the memory cell 12 is isolated from the amplifier circuit 10.

Subsequently, the word line WLL is set HIGH to turn the N-channel transistor Q1 ON (time $t_1$). Thereby, the sense amplifier 16 receives data of the memory cell 11. That is, the data of the memory cell 11 is applied to the bit line pairs BLS/bBLS.

Next, the isolating signal bISO-L is set LOW to turn the transistor Q35 OFF and turn the transistor Q36 ON (time $t_2$). Thereby, the voltage Vii is applied to the amplifier 10 in lieu of Vdd as the control signal ΦL. Since the voltage of the control signal ΦL changes from Vdd to Vii, the transistors Q9 and Q10 shown in FIG. 21 are switched OFF.

After that, the sense amplifier 16 amplifies data of the memory cell 11. After the data is amplified, the boost signal BOOST-L is set HIGH (time $t_3$). Then, the P-channel transistor Q39 switches ON, and the voltage of the control signal ΦL rises to Vpp. As a result, the transistors Q9, Q10 shown in FIG. 21 again turn ON, and amplified data is again written in the memory cell 11. Since the control signal ΦL changes to Vpp higher than Vdd, sufficient charge can be accumulated in the capacitor C1.

Subsequently, the word line WLL is set LOW (time $T_4$).

Further, by setting the isolating signal bISO-L HIGH and the boost signal BOOST-L LOW, the control signals ΦL and ΦR are returned to Vdd (time $T_5$). As a result, the transistors Q9 and Q10 maintain the ON states, and the transistors Q11 and Q12 change to the ON states. Simultaneously, by setting the precharge signal EQ HIGH, the bit line pairs BLL/bBLL, BLR/bBLR and BLS/bBLS are precharged.

In the conventional technique introduced above, in response to the change of the control signal ΦL to Vii, the bit line pair BLS/bBLS is isolated from the bit line pair BLL/bBLL. As a result, while the sense amplifier 16 amplifies data, noise caused by the coupling capacitance of the bit lines pair BLL/bBLL is prevented. Moreover, since the sense amplifier 16 is sufficient to amplify the potential difference between the bit lines of the bit line pair BLS/bBLS, it can amplify data quickly.

However, since this technique writes data in the memory cell again, the sense amplifier 16 has to amplify the potential difference between the bit lines of the bit line pair BLL/bBLL similarly to the bit line pair BLS/bBLS after it amplifies data in the bit line pair BLS/bBLS. The point of time where the sense amplifier 16 starts amplification of the potential difference of the bit line pair BLL/bBLL is the time $t_3$ where the control signal ΦL rises to Vpp.

At that time, since the control signal ΦL is rapidly amplified from Vii to Vpp, the transistors Q9, Q10 immediately change to the ON states. As a result, capacitance of the bit line pair BLL/bBLL is suddenly added to the capacitance of the bit line pair BLS/bBLS. As a result, the voltage of the bit line bBLS amplified to the HIGH level lowers due to the connection to the bit line bBLL. On the other hand, the voltage of the bit line BLS amplified to the LOW level rises due to the connection to the bit line BLL. That is, noise occurs in the bit line pair BLS/bBLS.

The noise may undesirably reverse the potential difference between the bit lines bBLS and BLS, which leads to false recognition of data.

SUMMARY OF THE INVENTION

A semiconductor storage device comprises a memory cell array including memory cells, and bit lines for transfer of data in the memory cells; an amplifier circuit connected to the bit lines to amplify data in the memory cells; a first switching element connected between the bit lines and the amplifier circuit; a first reference voltage source which applies to the gate of the first switching element a voltage for controlling the first switching element; a second switching element and a third switching element connected in series between the gate of the first switching element and the first reference voltage source, said second switching element and said third switching element being connected in parallel to each other; a second reference voltage source which applies to the gates of the second and third switching elements a voltage for controlling the second and third switching elements; and a first timing shift circuit connected between the gate of the third switching element and the second reference voltage source to delay the operation of the third switching element from the operation of the second switching element.

DETAILED DESCRIPTION OF THE INVENTION

Explained below are some embodiments of the invention with reference to the drawings. The embodiments, however, should not be construed to limit the invention. The embodiments explained below can be modified by using P-channel transistors instead of N-channel transistors or using N-channel transistors in lieu of P-channel transistors without losing the effects of the respective embodiments. In this case, however, levels of individual signals will need to be modified appropriately.

Figure 1:
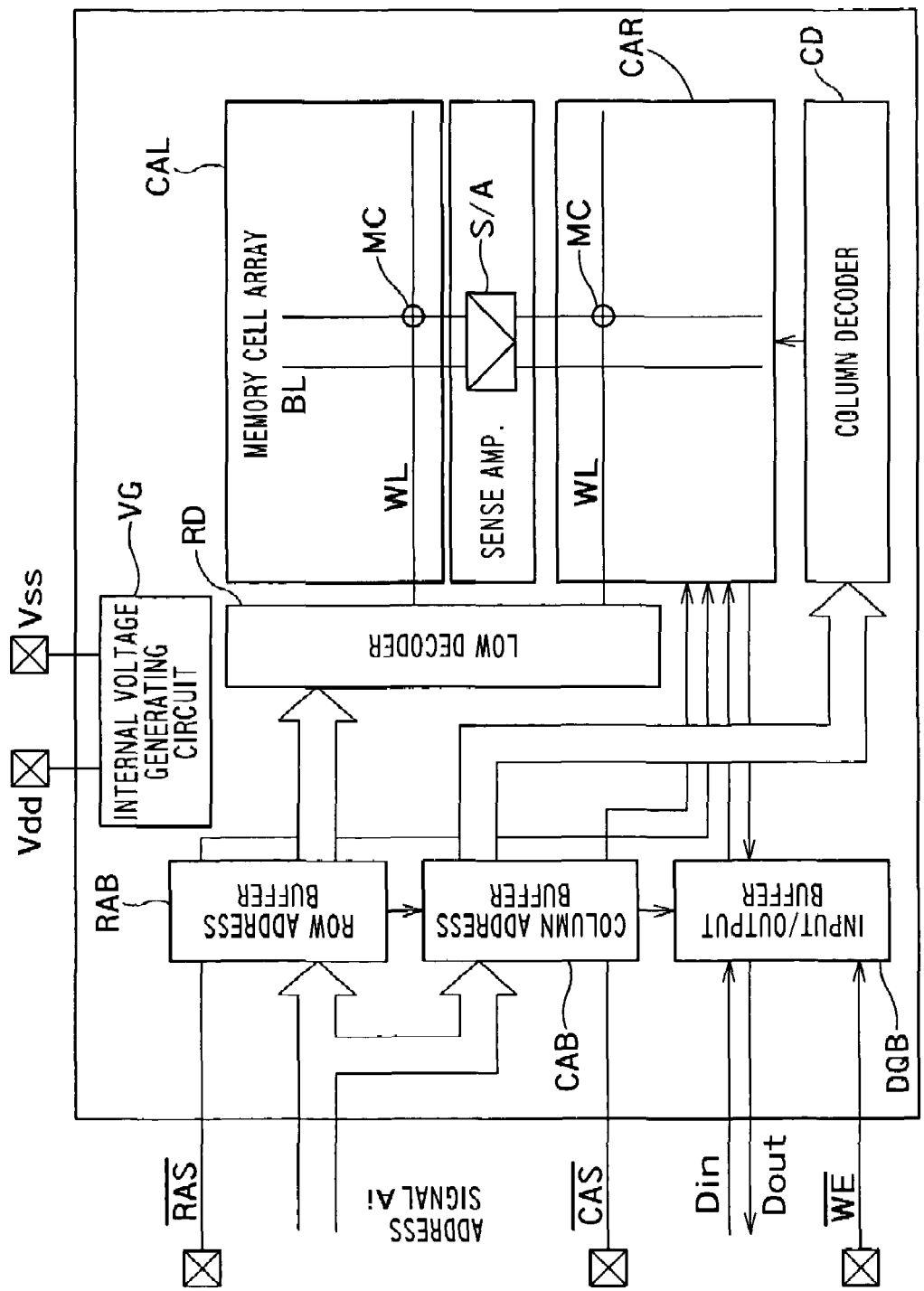
FIG. 1 is a block diagram of a DRAM-type semiconductor storage device according to the first embodiment of the invention.

FIG. 1 is a block diagram of a DRAM-type semiconductor storage device according to the first embodiment of the invention. The semiconductor storage device includes a memory cell array CAL, memory cell array CAR and a sense amplification region S/A. The memory cell arrays CAL and CAR include memory cells MC, bit lines BL and word lines WL. The sense amplification region S/A is connected to the bit lines BL. The sense amplification region S/A includes a sense amplifier 116 (see FIG. 2) for amplifying data in memory cells MC. The sense amplifier 116 is a shared sense amplifier for common use with both the memory cells CAL, CAR. The semiconductor storage device has buffers RAB, CAB and DQB for temporally storing externally applied signals RAS bar, CAS bar and WE bar, respectively; decoders RD and CD for decoding them; and an internal voltage generating circuit VG.

Figure 2:
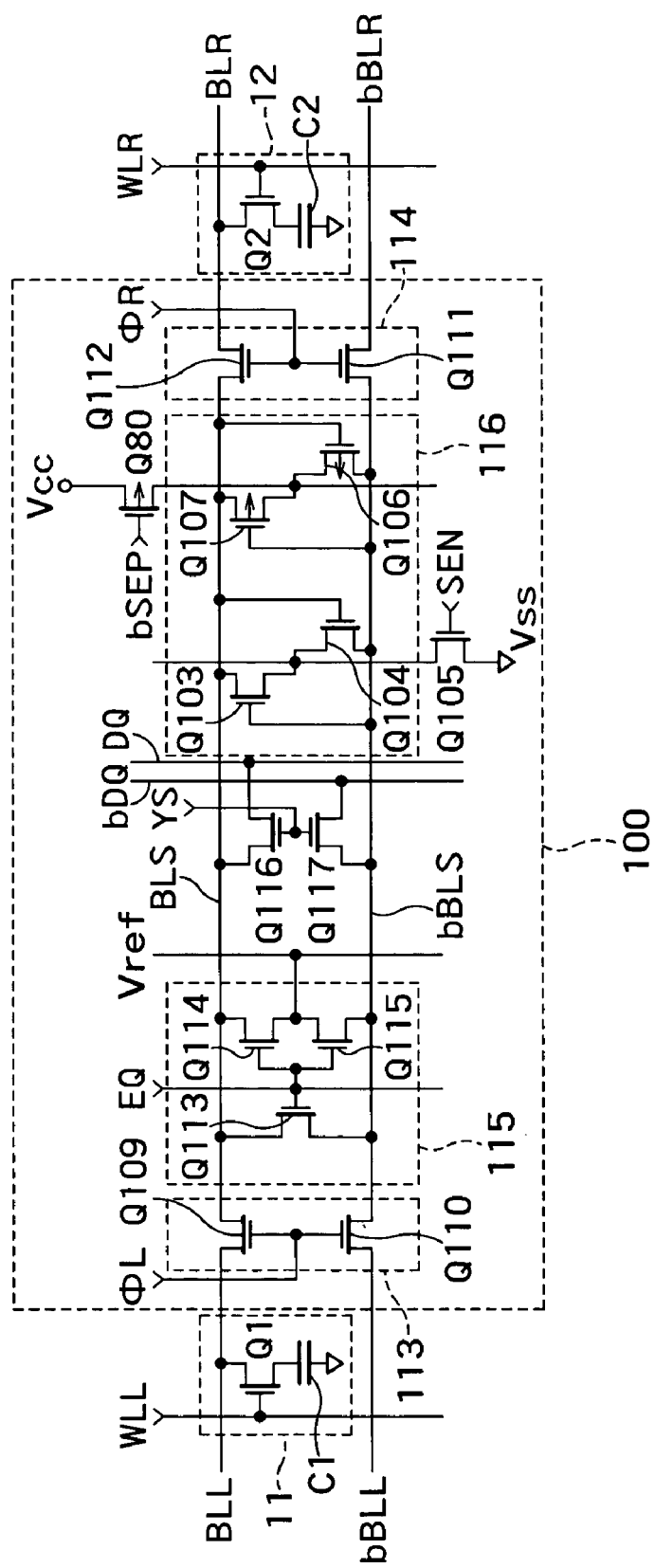
FIG. 2 is a circuit diagram of an amplifier circuit 100 equipped in a sense amplification region S/A inside a semiconductor storage device according to the first embodiment of the invention.

FIG. 2 is a circuit diagram of an amplifier circuit 100 equipped in the sense amplification region S/A. The memory cell 11 and the bit line pair BLL/bBLL shown on the left side of FIG. 2 belong to the memory cell array CAL. The memory cell 12 and the bit line pair BLR/bBLR shown on the right side of FIG. 2 belong to the memory cell array CAR. The bit line pair BLS/bBLS belong to the sense amplification region S/A. The bit line pair BLL/bBLL is connected to the memory cell 11. The bit line pair BLR/bBLR is connected to the memory cell 12. The bit line pair BLS/bBLS is connected to the sense amplifier 116 in the amplifier circuit 100. The bit line bBLL functions to transport the inverted signal of BLL, and it means BLL bar. The set of BLR and bBLR and the set of BLS and bBLS have the same relationship, respectively.

An N-channel transistor Q109 is connected between the bit lines BLL and BLS, and an N-channel transistor Q110 is connected between the bit lines bBLL and bBLS. An N-channel transistor Q112 is connected between the bit lines BLR and BLS, and an N-channel transistor Q111 is connected between the bit lines bBLR and bBLS. The transistors Q109 and Q110 are controlled by the control signal ΦL. The transistors Q102 and Q110 are controlled by the control signal ΦR. In case the memory cell 11 is selected, the transistors Q112 and Q111 are switched OFF, and accordingly, the bit lines BLS and bBLS are disconnected from the bit lines BLR and bBLR, respectively. In case the memory cell 12 is selected, the transistors Q109 and Q110 are switched OFF.

A precharge circuit 115 includes N-channel transistors Q113, Q114 and Q115. Gates of the transistors Q113, Q114 and Q115 are connected to the precharge signal EQ. Accordingly, the transistors Q113, Q114 and Q115 are controlled by the precharge signal EQ and can precharge the bit lines pairs BLL/bBLL, BLR/bBLR and BLS/bBLS to Vref.

The sense amplifier 116 includes N-channel transistors Q103, Q104 and P-channel transistors Q106, Q107. For amplifying data of the memory cell 11 or 12, an N-channel sense amplifier control signal SEN is set HIGH, and a P-channel sense amplifier control signal bSEP is set LOW. Accordingly, the sense amplifier 116 is activated and amplifies data received from the memory cell.

Figure 3:
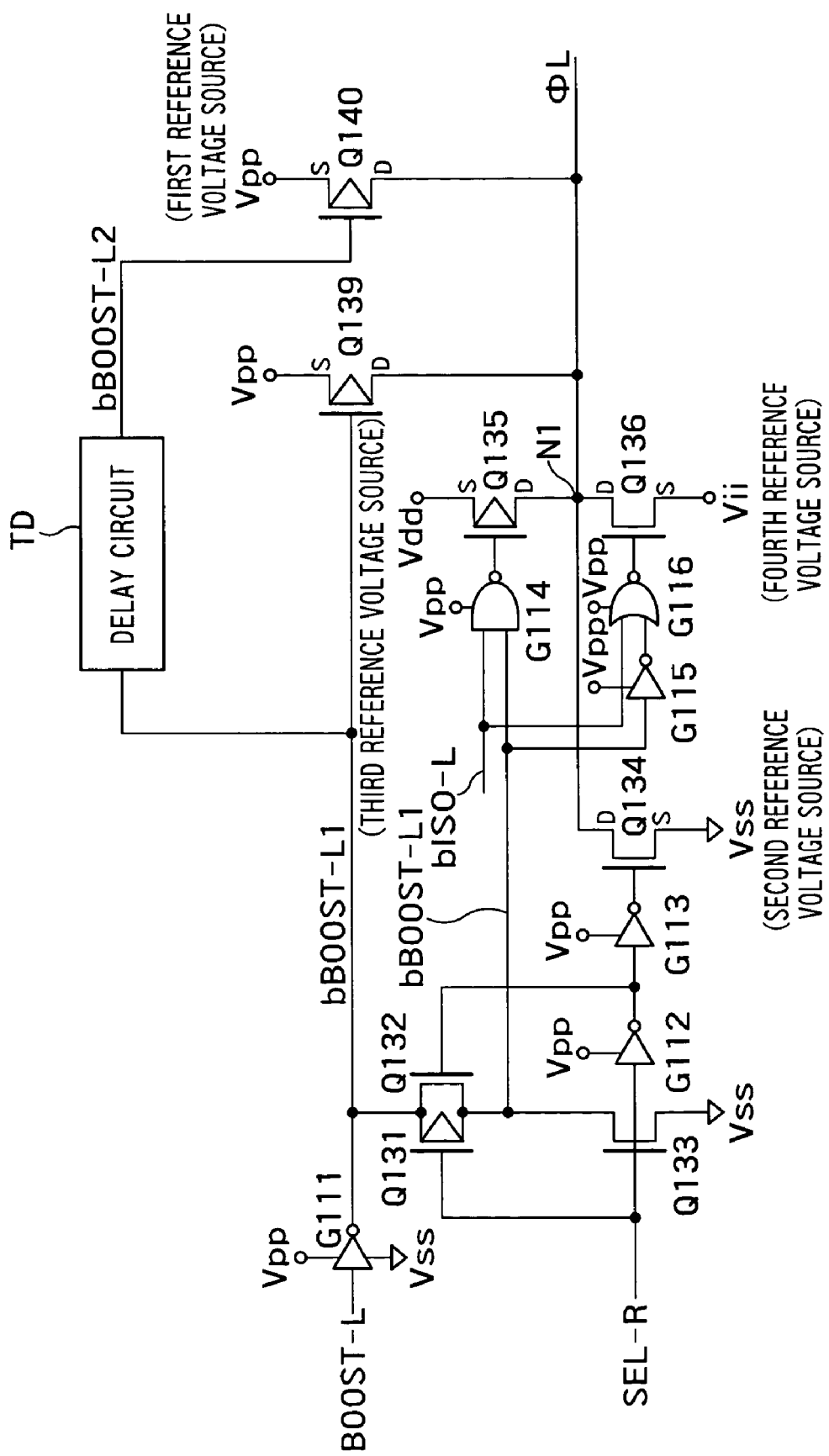
FIG. 3 is a circuit diagram of a control circuit 200 for controlling the amplifier circuit 100 inside the semiconductor storage device according to the first embodiment.

FIG. 3 is a circuit diagram of a control circuit 200 for controlling the amplifier circuit 100 inside the semiconductor storage device according to the instant embodiment. The control circuit 200 can output any of voltage values Vpp, Vss, Vdd or Vii as the control signal ΦL to the amplifier circuit 100. Vpp is the voltage of a first reference voltage source. Vss is the voltage of a second reference voltage source. Vdd is the voltage of a third reference voltage source. Vii is the voltage of a fourth reference voltage source.

Vdd is the voltage that turns the transistors Q109 and Q110 ON. Vdd is used as the control signal ΦL when the bit lines pairs BLL/bBLL, BLR/bBLR and BLS/bBLS are precharged.

Vpp is the voltage that turns the transistors Q109, Q110 On to a high driving state. Vpp is higher than Vdd. By adjusting the control signal ΦL to Vpp when amplified data is written again in the memory cell 111 or 112, sufficient electric charge can be given to the capacitor C1 or C2.

Vii is the voltage that turns the transistors Q102, Q110 OFF. By adjusting the control signal ΦL to Vii when the sense amplifier 116 amplified data, the bit line pair BLS/bBLS is isolated from the bit line pair BLL/bBLL. As a result, the sense amplifier 116 can amplify the data in the bit line pair BLS/bBLS without influences of noise caused by the coupling capacitance of the bit line par BLL/bBLL.

Vss is the ground voltage. When the control signal ΦL is Vss, the transistors Q109, Q110 turn OFF completely. Vii is higher than Vss and lower than Vdd.

Figure 22:
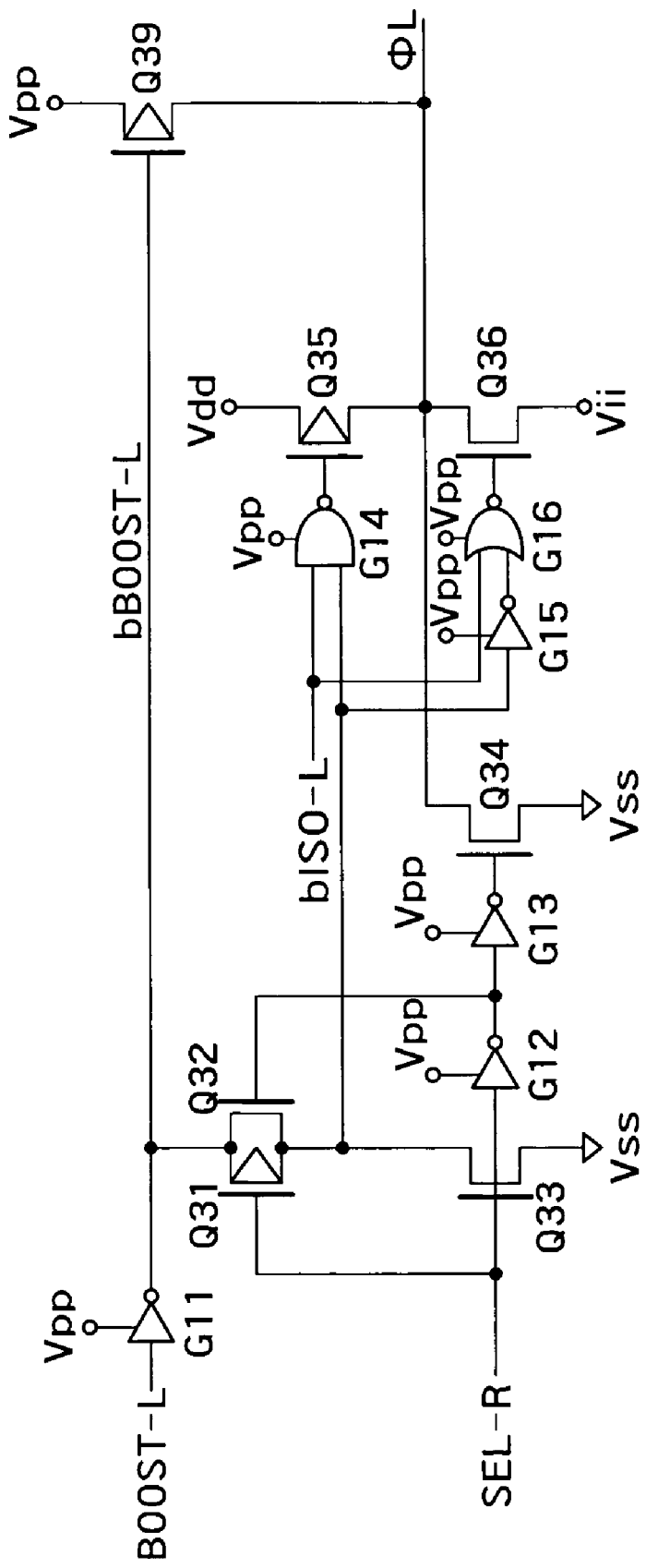
FIG. 22 is a circuit diagram of a control circuit 20 for applying a control signal ΦL to the amplifier circuit 10 shown in FIG. 21.
Figure 23:
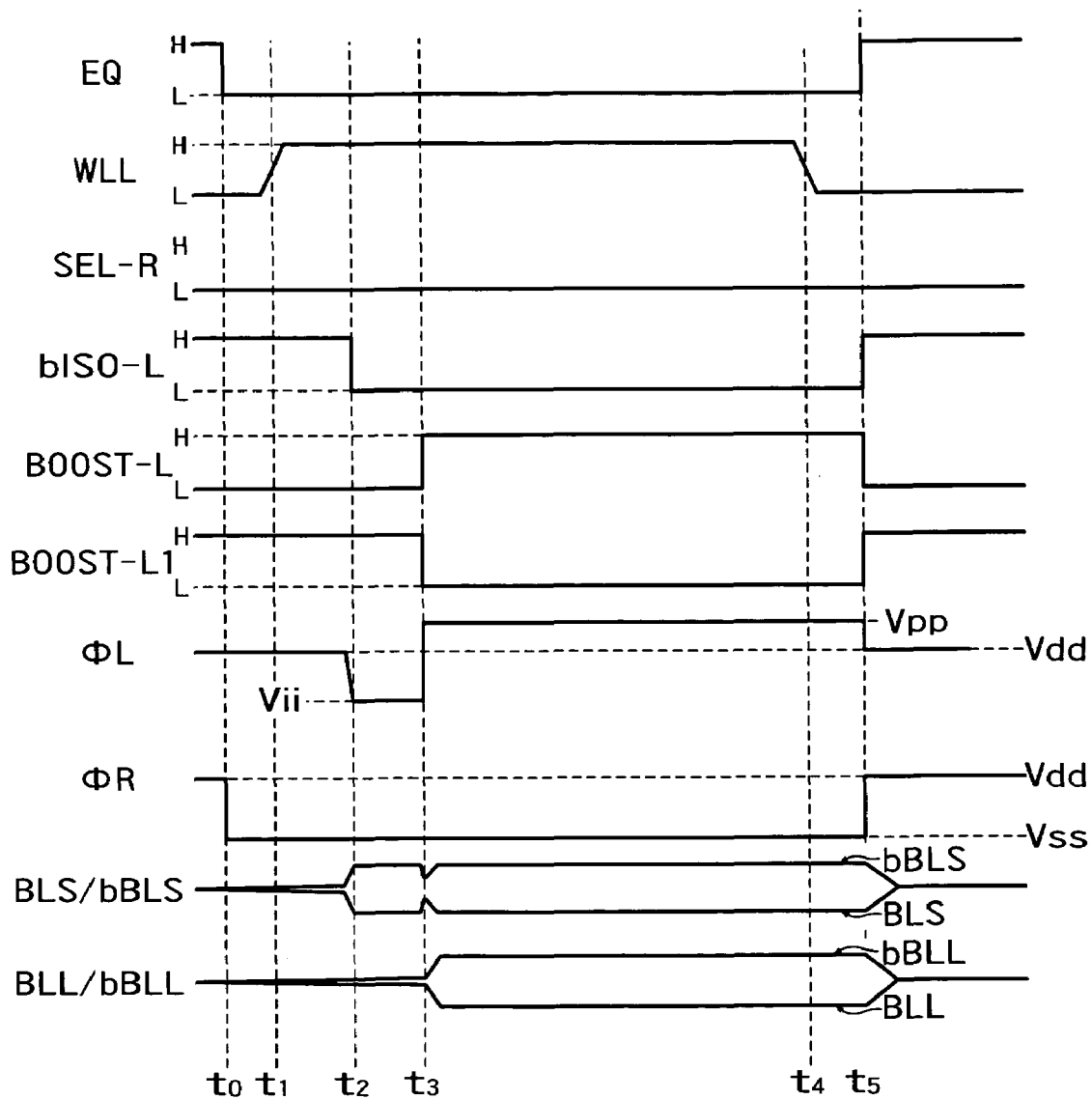
FIG. 23 is a timing chart showing operations of the amplifier circuit 10 shown in FIG. 21 and the control circuit 20 shown in FIG. 22.

A P-channel transistor Q139 is connected in series between the first reference voltage source and the gates of the transistors Q109 and Q110 shown in FIG. 2. The source of the transistor Q139 is connected to the first reference voltage source, and its drain is connected to gates of the transistors Q109 and Q110. The size of the transistor Q139 is smaller than the transistor Q39 (see FIG. 22).

A P-channel transistor Q140 is connected in series between the first reference voltage source and gates of the transistors Q109 and Q110 shown in FIG. 2, and further connected in parallel to the transistor Q139. The source of the transistor Q140 is connected to the first reference voltage source, and its drain is connected to the gates of the transistors Q109, Q110. The size of the transistor Q140 is larger than the transistor Q139.

The gate of the transistor Q139 is connected to an inverter G111. The gate of the transistor Q140 is connected to the inverter G111 via a delay circuit TD. The inverter G111 inverts the boost signal BOOST-L to a boost signal bBOOST-L1. Therefore, when the boost signal BOOST-L is HIGH, Vss (LOW) is output as the boost signal bBOOST-L1. When the boost signal BOOST-L is LOW, Vpp (HIGH) is output as the boost signal bBOOST-L1.

Since the delay circuit TD is connected to the gate of the transistor 140, a boost signal bBOOST-L2 is given to the transistor Q140 with a time delay after the point of time where the boost signal bBOOST-L1 is given to the transistor Q139. Therefore, operation of the transistor Q140 is behind the operation of the transistor Q139.

A P-channel transistor Q135 and an N-channel transistor 136 are connected in series between the third reference voltage source and the fourth reference voltage source. The node N1 between the transistors Q135 and Q136 is connected to the second reference voltage source via the N-channel transistor Q134.

Drains of the transistors Q135 and Q136 are connected to the node N1. The source of the transistor Q135 is connected to the third reference voltage source. The source of the transistor Q136 is connected to the fourth reference voltage source. The source of the transistor Q134 is connected to the second reference voltage source, and its drain is connected to the gate of the transistor Q109 and Q110.

Furthermore, the node N1 is connected to the gates of the transistors Q109 and Q110 shown in FIG. 2. Therefore, the control circuit 200 can output Vss (second reference voltage source), Vdd (third reference voltage source) or Vii (fourth reference voltage source) as the control signal ΦL from the node N1. Vpp (first reference voltage source) can be output through the transistor Q139 or Q140.

The output of a NAND gate G114 is connected to the gate of the transistor Q135. The output of a NOR gate G116 is connected to the gate of the transistors Q136. The NAND gate G114 and the NOR gate G116 commonly introduce the isolation signal bISO-L and the boost signal bBOOST-L1. However, the NOR gate G116 introduces the boost signal bBOOST-L1 in the inverted form.

Transistors Q131 and Q132 are connected between the input of the NAND gate G114 and the output of the inverter G111. An N-channel transistor Q133 is connected between the input of the NAND gate G114 and the second reference voltage source.

The transistors Q131, Q132, Q134 and Q134 are controlled by the select signal SEL-R. The select signal SEL-R is given to the gate of the transistor Q132 via an inverter G112. Therefore, the gate of the transistor Q132 is supplied with the inverted signal of the select signal SEL-R. The select signal SEL-R is given to the gate of the transistor Q134 via the inverters G112 and G113. Therefore, the gate of the transistor Q134 is supplied with the select signal SEL-R.

The select signal SEL-R is set HIGH when the memory cell 12 is selected. At that time, the transistors Q131 and Q132 are OFF, and the transistors Q133 and Q134 are ON. Therefore, voltage of the control signal ΦL becomes Vss.

On the contrary, the select signal SEL-R is set LOW when the memory cell 11 is selected. At that time, the transistors Q131 and Q132 are ON, and the transistors Q133 and Q134 are OFF. Therefore, voltage of the control signal ΦL becomes Vdd, Vii or Vpp, when the memory cell 11 is selected.

Aspects of individual signals in case of setting the control signal ΦL to Vdd, Vii or Vpp will be explained below.

To set the voltage of the control signal ΦL to Vpp, the boost signal bBOOST-L1 may be set LOW. Thereby, the transistors Q139 and Q140 turn ON.

At that time, the NAND gate G114 is supplied with LOW as the boost signal bBOOST-L1. The NOR gate G116 is supplied with HIGH as the inverted signal of the boost signal bBOOST-L1. Responsively, irrespectively of the level of the isolating signal bISO-L, the transistors Q135 and Q136 turn OFF. Therefore, the gate of the transistor Q109 is connected to the first reference voltage source, and detached from the third reference voltage source and the fourth reference voltage source. As a result, voltage of the control signal ΦL becomes Vpp.

To set the voltage of the control signal ΦL to Vdd, the boost signal bBOOST-L1 and the isolating signal bISO-L may be set HIGH. Since the boost signal bBOOST-L1 is HIGH, the transistors Q139 and Q140 are OFF.

At that time, the NAND gate G114 is supplied with HIGH as the boost signal bBOOST-L1. The NOR gate G116 is supplied with LOW as the inverted signal of the boost signal bBOOST-L1. Furthermore, since the isolating signal bISO-L is HIGH, the transistor Q135 turns ON, and the transistor Q136 turns OFF. Therefore, the gate of the transistor Q109 is connected to the third reference voltage source, and detached from the first reference voltage source and the fourth reference voltage source. As a result, voltage of the control signal ΦL becomes Vdd.

To set the voltage of the control signal ΦL to Vii, the boost signal bBOOST-L1 may be set HIGH and the isolating signal bISO-L LOW. Responsively, the transistor Q135 turns OFF, and the transistor Q136 turns ON. Therefore, the gate of the transistor Q109 is connected to the fourth reference voltage source, and detached from the first reference voltage source and the third reference voltage source. As a result, voltage of the control signal ΦL becomes Vii.

Figure 4:
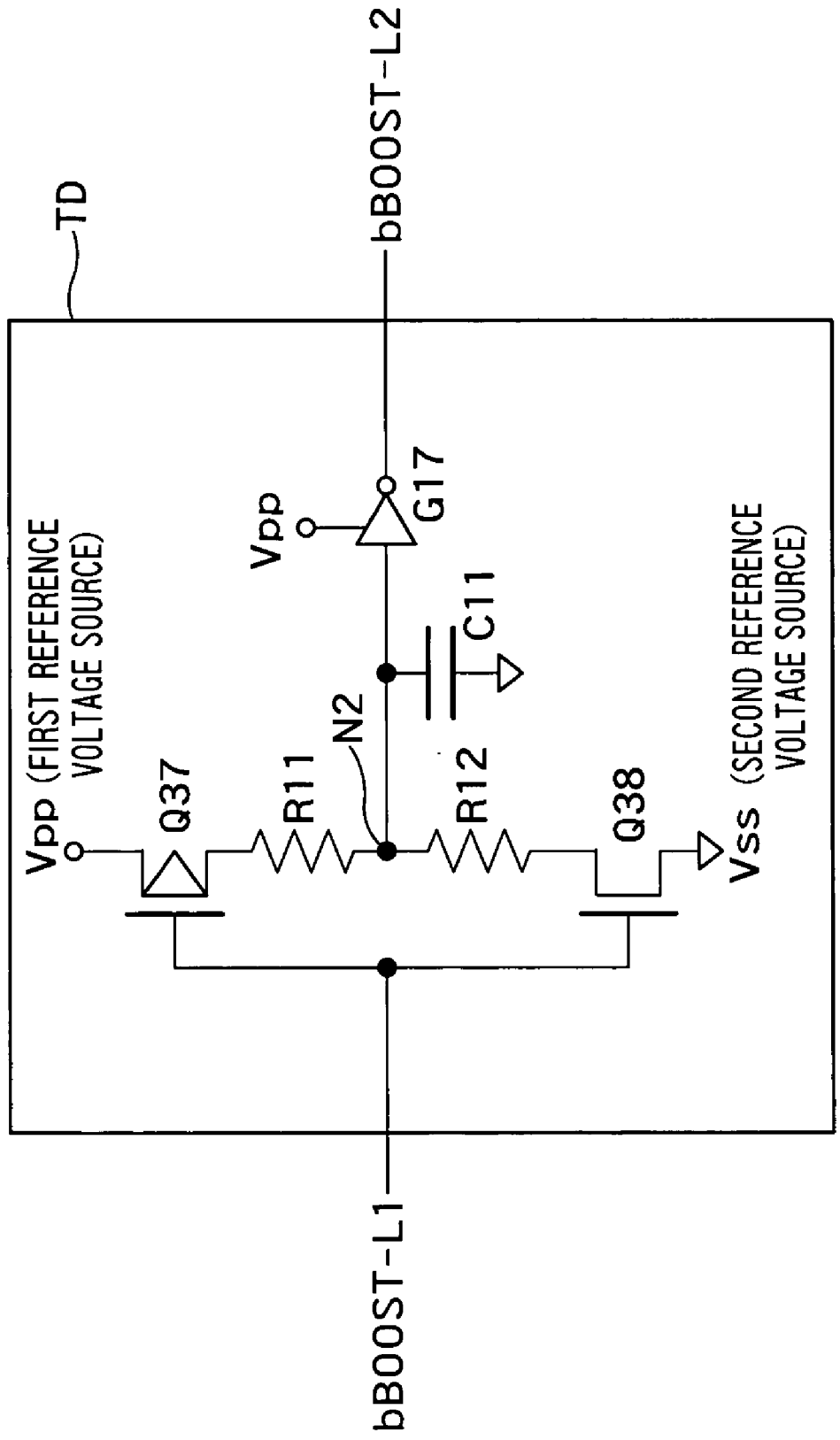
FIG. 4 is a circuit diagram of an embodiment of a delay circuit TD.

FIG. 4 is a circuit diagram of an embodiment of the delay circuit TD. The delay circuit TD includes resistors R11 and R12 connected in series between the first reference voltage source and the second reference voltage source. A transistor Q37 is connected between the first reference voltage source and the resistor R11. A transistor Q38 is connected between the second reference voltage source and the resistor R12. The boost signal bBOOST-L1 is input to the gate of the transistor Q37 and the gate of the transistor Q38.

An inverter G17 is connected to the node N2 between the resistors R11 and R12, and the boost signal bBOOST-L2 is output from the inverter G17. A capacitor C11 is connected between the node N2 and the second reference voltage source. An RC delay circuit is composed of the capacitor C11 and the resistor R11 and R12.

In case the boost signal bBOOST-L1 is LOW, Vpp is output from the delay circuit TD. Responsively, the capacitor C1 is charged by the first reference voltage source.

In case the boost signal bBOOST-L1 is switched HIGH, Vss is output from the delay circuit TD instead of Vpp. Responsively, the electric charge accumulated in the capacitor C11 is discharged to the second reference voltage source via the resistor R12. The output of the boost signal bBOOST-L2 is delayed for the length of time required for discharging the electric charge from the capacitor C11.

Figure 5:
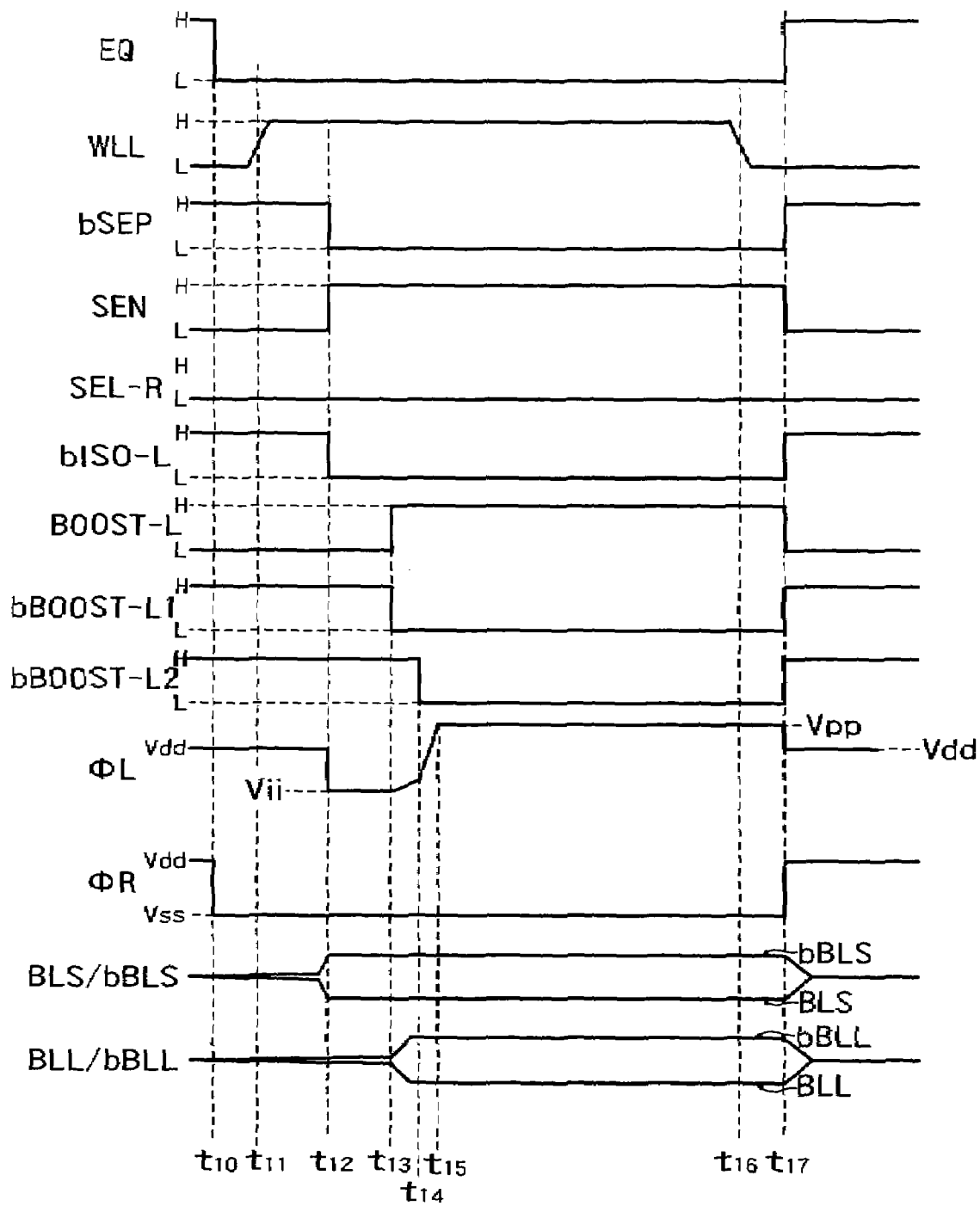
FIG. 5 is a timing chart showing operations of the amplifier circuit 100 shown in FIG. 2 and the control circuit 200 shown in FIG. 3.

FIG. 5 is a timing chart showing operations of the amplifier circuit 100 shown in FIG. 2 and the control circuit 200 shown in FIG. 3. With reference to FIGS. 2, 3 and 5, operations of the amplifier circuit 100 for amplifying data of the memory cell 11 will be explained.

Before the amplifier circuit 100 reads out data, voltage of the control signals ΦL and ΦR is Vdd. Accordingly, the transistors Q109, Q110, Q112 and Q111 are ON. When the amplifier circuit 100 reads out data of the memory cell 11, the select signal SEL-R is LOW.

First, the precharge signal EQ is set LOW to turn OFF the precharge circuit 115 (time $t_{10}$). At that time, in response to the change of the voltage of the control signal ΦR to Vss, the transistors Q111 and Q112 are switched OFF. Accordingly, the memory cell 12 is isolated from the amplifier circuit 100.

Next, the word line WLL is set HIGH to turn the transistor Q1 ON (time $t_{11}$). Responsively, the sense amplifier 116 receives data of the memory cell 11. That is, the data of the memory cell 11 is applied to the bit line pairs BLS/bBLS.

Subsequently, the isolating signal bISO-L is set LOW (time $t_{12}$). Responsively, the voltage of the control signal ΦL changes from Vdd to Vii. Therefore, the transistors Q109 and Q110 shown in FIG. 2 are switched OFF. As a result, the bit line pair BLS/bBLS is separated from the bit line pair BLL/bBLL. That is, the isolating signal bISO-L determines the timing of separation of the bit line pair BLS/bBLS from the bit line pair BLL/bBLL.

After the time $t_{12}$, the sense amplifier 116 amplifies data of the memory cell 11.

After the data is amplified, the boost signal BOOST-L is set HIGH (time $t_{13}$). That is, the boost signal bBOOST-L1 is set LOW. The rising of the control signal ΦL in the instant embodiment is more moderate than that of the conventional circuit. This is because the transistor Q139 is relatively small-sized than the transistor Q140, and it takes time to raise the voltage of the gates of the transistors Q109, Q110.

Because of the modest rising of the control signal ΦL, the transistors Q109 and Q110 are gradually switched ON. Therefore, the bit line pair BLL/bBLL is gradually connected to the bit line pair BLS/bBLS. Thus, it is prevented that the capacitance of the bit line pair BLL/bBLL is suddenly added to the capacitance of the bit line pair BLS/bBLS. Therefore, the sense amplifier 116 can amplify the data of the bit line pair BLL/bBLL gradually to the same potential as that of the bit line pair BLS/bBLS. As a result, generation of noise in the bit line pair BLS/bBLS can be prevented. In addition, inversion of the potential difference between the bit lines bBLS and BLS does not occur.

Subsequently, the boost signal bBOOST-L2 delayed by the delay circuit TD becomes LOW (time $t_{14}$). Responsively, the transistor Q140 is switched ON. Since both transistors Q139 and Q140 are currently ON, the control signal ΦL is rapidly raised to Vpp.

However, at the time $t_{14}$, data of the bit line pair BLL/bBLL is already amplified. Therefore, noise generated by the rapid increase of the control signal ΦL to Vpp does not matter. Rather, since the voltage of the control signal ΦL rises to Vpp quickly, the amplified data can be written quickly in the memory cell 11. Thus, the semiconductor storage device according to the instant embodiment will be speeded up.

In response to the change of the control signal ΦL to Vpp, the transistors Q109, Q110 again switch ON (time $t_{15}$). As a result, the amplified data is again written in the memory cell 11. At that time, since the voltage of the control signal ΦL is Vpp which is higher than Vdd, sufficient electric charge can be accumulated in the capacitor C1.

After that, the word line WLL is set LOW (time $t_{16}$).

Further, by setting the isolating signal bISO-L HIGH and the boost signal BOOST-L LOW, the control signals ΦL and ΦR are returned to Vdd (time $t_{17}$). As a result, the transistors Q109 and Q110 remain ON. The transistors Q111 and Q112, however, switch ON. Simultaneously, by setting the precharge signal EQ HIGH, the bit line pairs BLL/bBLL, BLR/bBLR and BLS/bBLS are precharged.

According to the instant embodiment, when the sense amplifier 116 amplifies data, the control signal ΦL starts rising modestly from Vii to Vpp. Therefore, noise caused by the capacitance of the bit line pair BLL/bBLL can be prevented.

In addition, according to the instant embodiment, once the sense amplifier 116 completes amplification of data, the control signal ΦL is rapidly raised. Therefore, the sense amplifying operation can be speeded up.

Since the transistors Q139 and Q140 are P-channel transistors, they can be driven without the need of adding voltage sources other than the first to fourth reference voltage sources.

Figure 6:
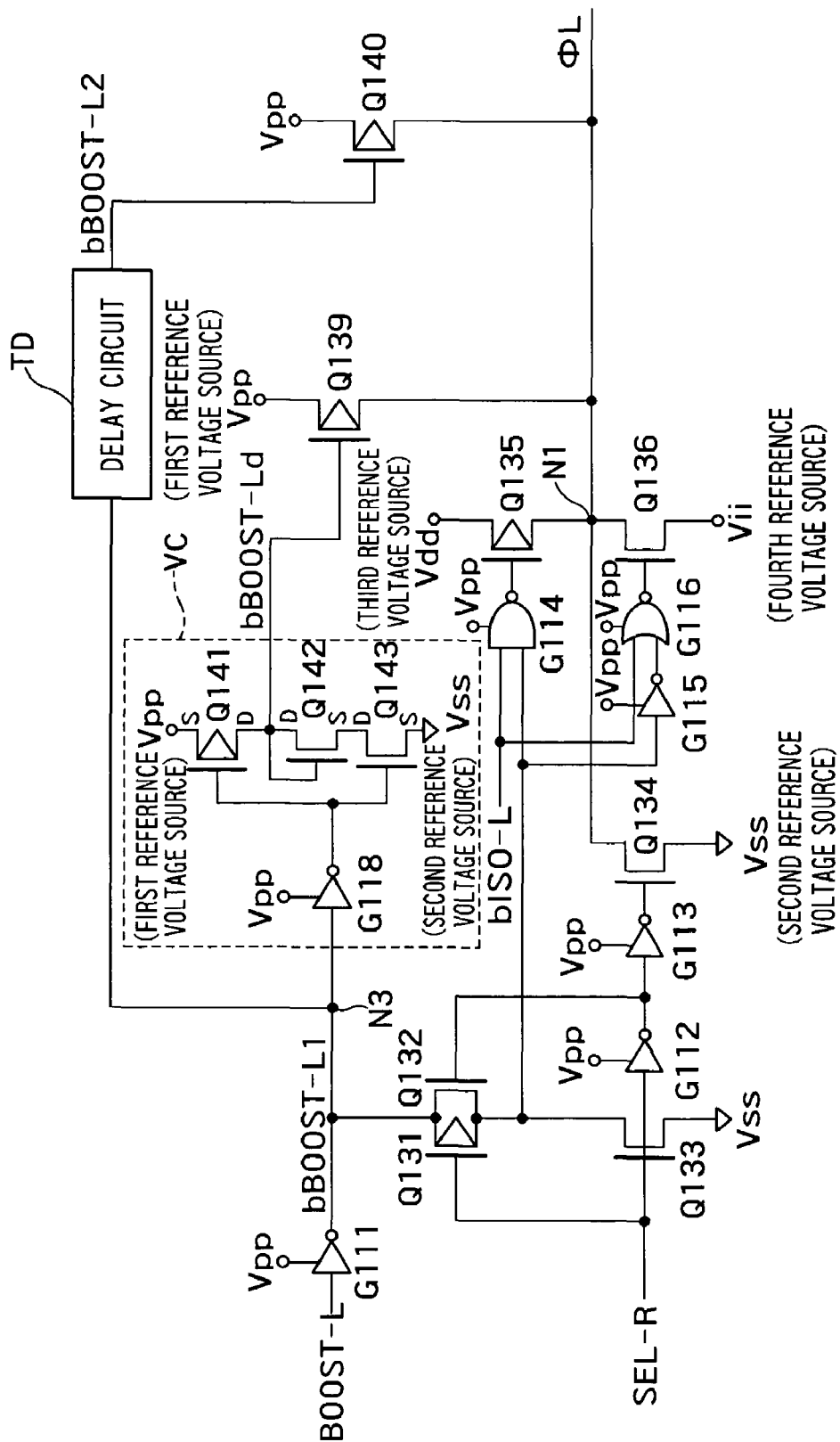
FIG. 6 is a circuit diagram of a control circuit 300 in the second embodiment of the invention.

FIG. 6 is a circuit diagram of a control circuit 300 in the second embodiment of the invention. This embodiment is different from the first embodiment in the feature that a voltage control circuit VC is connected between the gate of the transistor Q139 and the node N3. The node N3 is the node of the delay circuit TD and the inverter G111.

The voltage control circuit VC includes an N-channel transistor Q142 connected between the first reference voltage source and the second reference voltage source. The gate and the drain of the transistor Q142 are short-circuited, and they are connected to the gate of the transistor Q139.

A P-channel transistor Q141 is connected between the drain of the transistor Q142 and the first reference voltage source. An N-channel transistor Q143 is connected between the source of the transistor Q142 and the second reference voltage source. Further, an inverter G118 is connected between the gate of the transistors Q141, Q143 and the output of the inverter G111.

Operations of the control circuit 300 will be explained below. The voltage control circuit VC operates to introduce the voltage signal bBOOST-L1 and output a boost signal bBOOST-Ld.

Since the P-channel transistor Q141 and N-channel transistor Q143 share a common gate, one of the transistors Q141, Q143 is ON and the other is OFF.

In case the boost signal bBOOST-L1 is set HIGH, the transistor Q141 turns ON, and the transistor Q143 turns OFF. Therefore, the boost signal bBOOST-Ld becomes Vpp (HIGH). The boost signal bBOOST-Lb under this condition is the same as the boost signal bBOOST-L1 of the first embodiment.

On the other hand, in case the boost signal bBOOST-L1 is set LOW, the transistor Q143 turns ON, and the transistor Q141 turns OFF. Since the second reference voltage source is connected to the source of the transistor Q142, the voltage of the boost signal bBOOST-Ld becomes the sum of Vss and the threshold value of the transistor Q142. That is, the voltage of the bBOOST-Ld becomes Vss+Vth(Q142).

Figure 7:
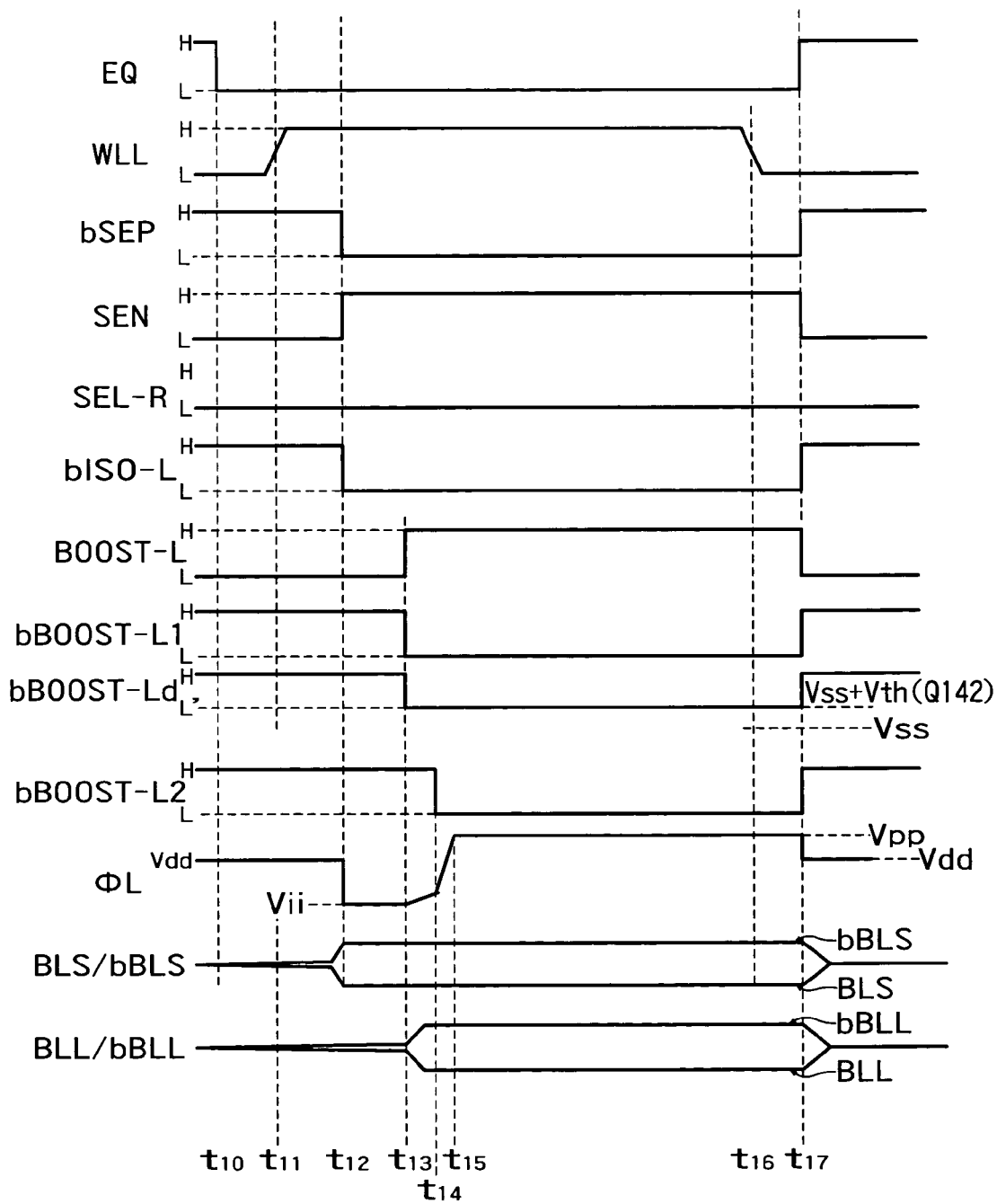
FIG. 7 is a timing chart showing operations according to the second embodiment.

FIG. 7 is a timing chart showing operations according to the second embodiment. The second embodiment is different from the first embodiment in the feature that, at the time $t_{13}$, the boost signal bBOOST-Ld decreases only to Vss+Vth (Q142) and does not decrease to Vss as the boost signal bBOOST-L1 does.

Therefore, the rising of the control signal ΦL from the time $t_{13}$ to the time $t_{14}$ is more moderate than that of the first embodiment. Thus, the instant embodiment can prevent noise generated in the bit line pair BLS/bBLS more reliably than the first embodiment.

Figure 8:
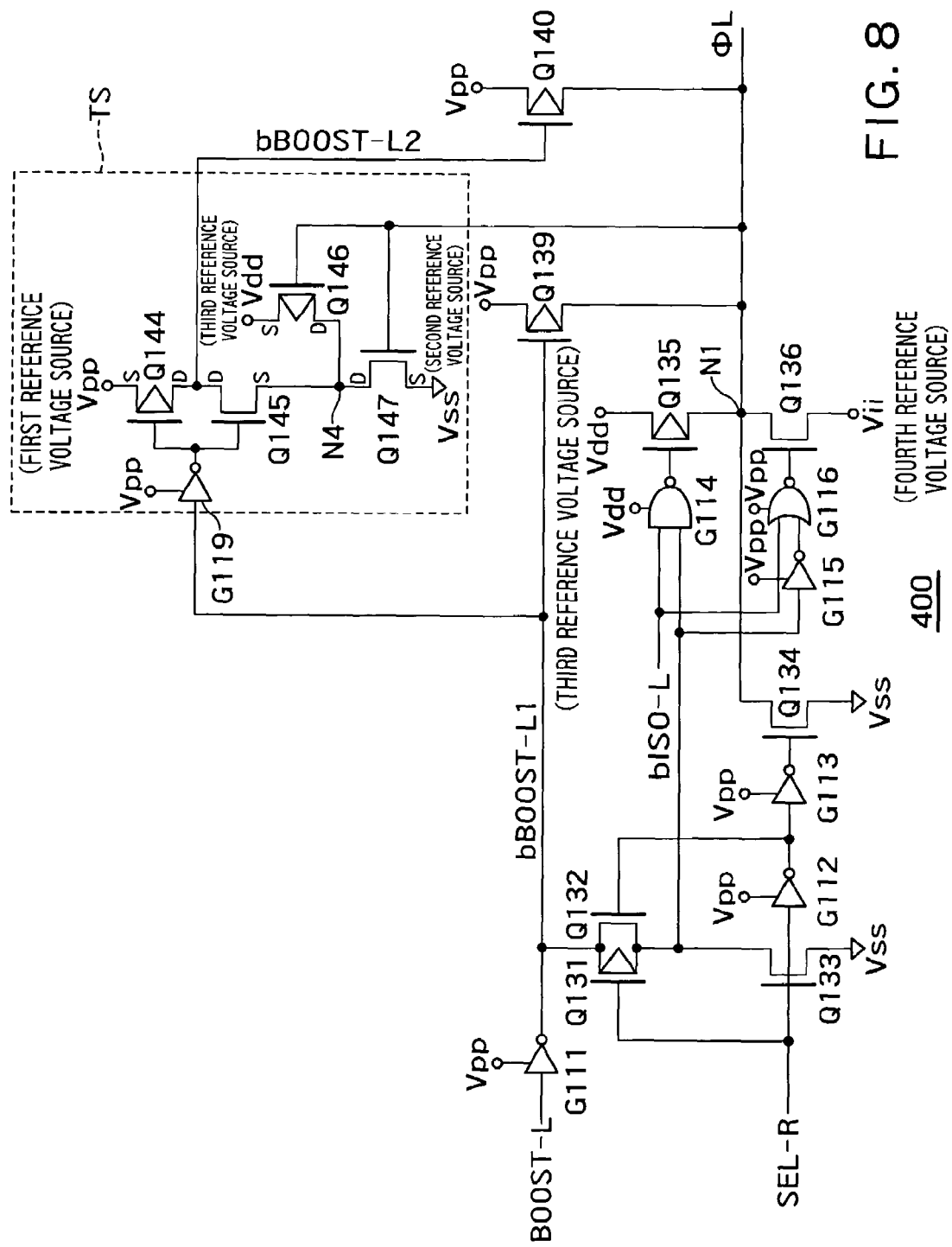
FIG. 8 is a circuit diagram of a control circuit 400 in the third embodiment of the invention.

FIG. 8 is a circuit diagram of a control circuit 400 in the third embodiment of the invention. This embodiment is different from the first embodiment in the use of a timing shift circuit TS different from the delay circuit TD instead of the delay circuit TD. The timing shift circuit TS includes P-channel transistors Q144, Q146, N-channel transistors Q145, Q147 and inverter G119.

The source of the transistor Q146 is connected to the third reference voltage source. The drain of the transistor Q146 is connected to the gate of the transistor Q140 via the transistor Q145.

The source of the transistor Q147 is connected to the second reference voltage source. Similarly to the drain of the transistor Q146, the drain of the transistor Q147 is connected to the gate of the transistor Q140 via the transistor Q145. Both the gate of the transistor Q146 and the gate of the transistor Q147 are connected to the gates of the transistors Q109 and Q110.

The source of the transistor Q144 is connected to the first reference voltage source. The drain of the transistor Q144 is connected to the gate of the transistor Q140. The source of the transistor Q145 is connected to the drains of the transistors Q146 and Q147. Similarly to the drain of the transistor Q144, the drain of the transistor Q145 is connected to the gate of the transistor Q140. The gates of the transistors Q144 and Q145 are both connected to the node between the inverter G111 and the gate of the transistor Q139 via the inverter G119.

Next explained are operations of the control circuit 400.

In case the boost signal bBOOST-L1 is set HIGH, the transistor Q144 turns ON, and the transistor Q145 turns OFF. Therefore, Vpp is output as the boost signal bBOOST-L2. This operation is the same as the first embodiment.

In case the boost signal bBOOST-L1 is set LOW, the transistor Q145 turns ON and the transistor Q144 turns OFF. Therefore, the voltage at the node N4 of the drain of the transistor Q146 and the drain of the transistor Q147 is output as the boost signal bBOOST-L2.

At the point of time (see the time $t_{13}$ of FIG. 9) where the boost signal bBOOST-L1 is switched from HIGH to LOW, the voltage of the control signal ΦL is Vii. Therefore, the transistor Q146 is ON with the feedback of the control signal ΦL, and the transistor Q147 is OFF with the feedback of the control signal ΦL. Therefore, the voltage at the node N4, i.e. the voltage of the boost signal bBOOST-L2, becomes Vdd. As a result, the transistor Q140 remains OFF.

When the voltage of the control signal ΦL reaches from vii to Vdd−Vth(Q146) (called the set voltage Vset hereunder), the transistor Q146 is switched OFF. Threshold value of the transistor Q147 is set lower than Vset. Therefore, at the point of time where the transistor Q146 is switched OFF, the transistor Q147 is already ON. Accordingly, the voltage at the node N4, i.e. the voltage of the boost signal bBOOST-L2, becomes Vss, and it results in turning the transistor Q140 ON.

Figure 9:
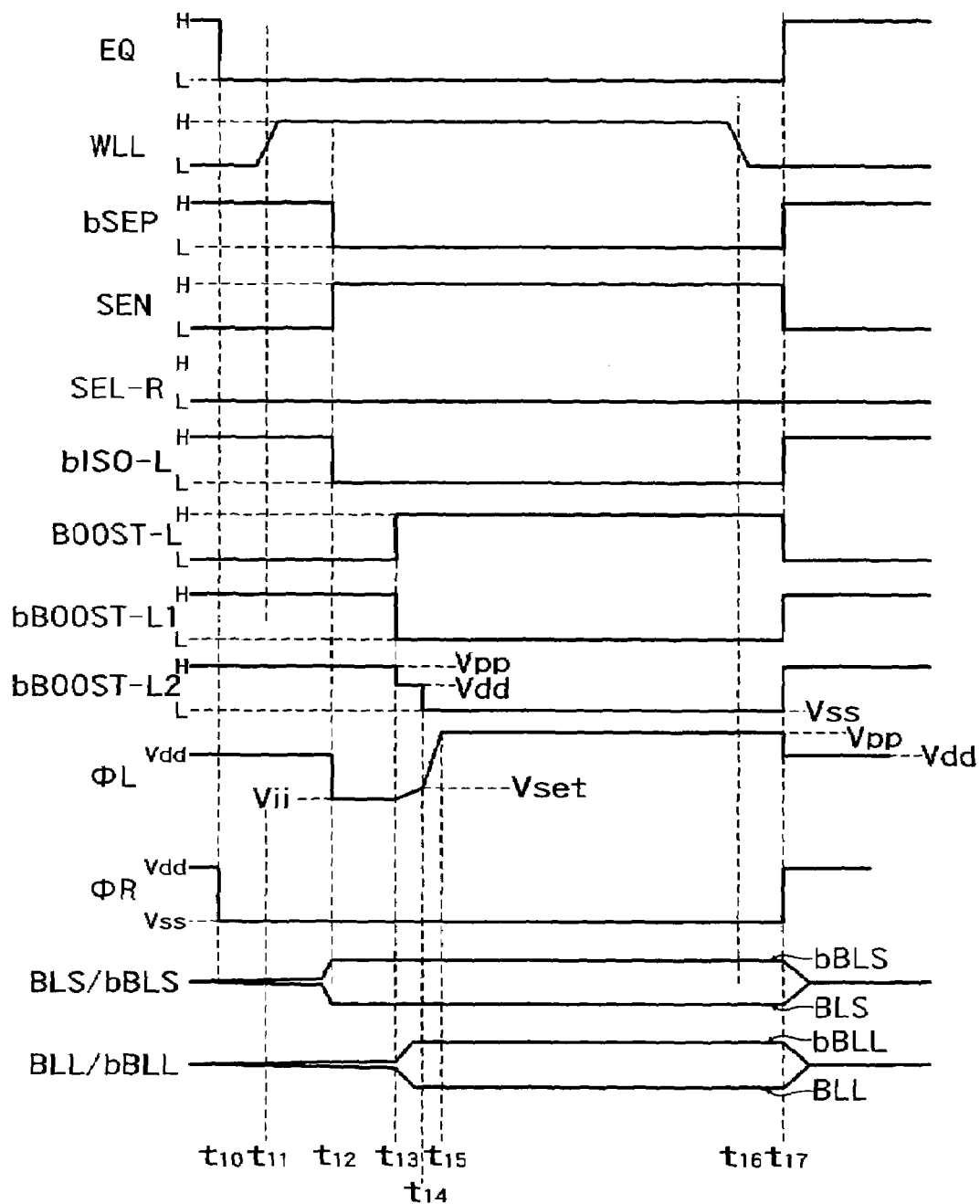
FIG. 9 is a timing chart showing operations according to the third embodiment of the invention.

FIG. 9 is a timing chart showing operations according to the third embodiment of the invention. This embodiment is different from the first embodiment in that the transistor Q140 switched ON when the control signal ΦL reaches the set voltage Vset. Operations of this embodiment from the time $t_{10}$ to the time $t_{12}$ are identical to those of the first embodiment.

At the time $t_{13}$, the boost signal bBOOST-L1 is switched from HIGH to LOW. Then, the transistor Q144 turns OFF and the transistor Q145 turns ON. At that time, the transistor Q146 is ON, and the transistor Q147 is OFF. Therefore, the boost signal bBOOST-L2 is reduced from Vpp to Vdd.

At the time $t_{14}$, the control signal ΦL reaches the set voltage Vset. Responsively, the transistor Q146 turns OFF, and the transistor Q147 turns ON. Therefore, the voltage of the boost signal bBOOST-L2 is reduced from Vdd to Vss. At that time, since the transistor Q140 turns ON, the control signal ΦL rapidly rises to Vpp.

As already explained, the first embodiment uses the RC delay circuit as the timing shift circuit. Resistors and capacitors, in general, are elements subject to variance depending upon their manufacturing process. Therefore, there is the possibility that the transistor Q140 turns ON approximately simultaneously with the transistor Q139. In contrast, there is also the possibility that a long time required for the transistor Q140 to turn ON disturbs the high-speed operation of the amplifier circuit.

In the instant embodiment, however, since the timing shift circuit is entirely composed of transistors, variance by the manufacturing process is relatively small. Moreover, the transistor Q140 turns ON under the condition that the control signal ΦL exceeds the set voltage Vset. Therefore, the transistor Q140 does not turn ON before the control signal ΦL is raised to the set voltage Vset via the transistor Q139. Moreover, when the control signal ΦL is raised to exceed the set voltage Vset via the transistor Q139, the transistor Q140 turns ON reliably.

As such, the instant embodiment can determine the timing for raising the control signal ΦL to Vpp without worrying about variance by the manufacturing process.

Figure 10:
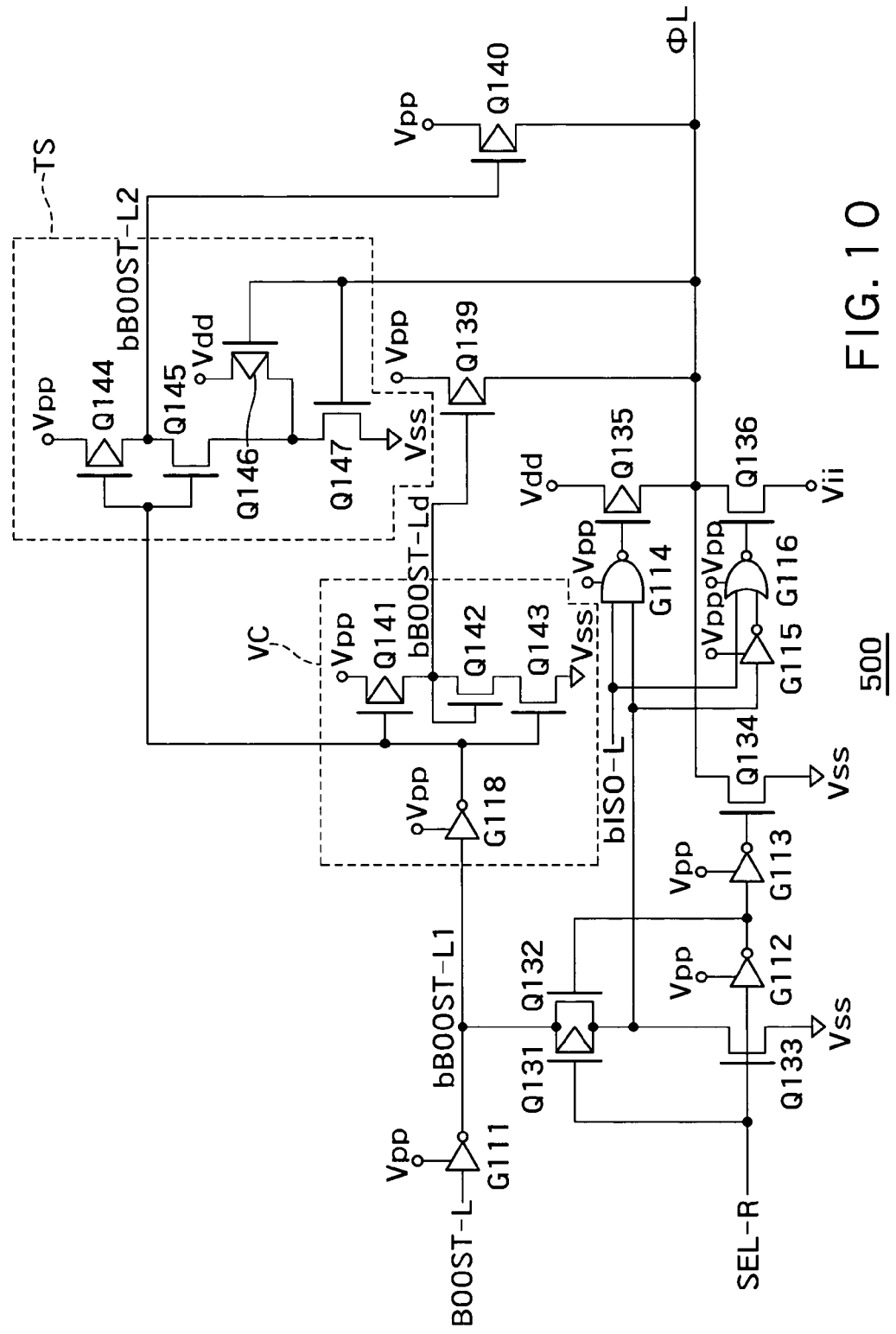
FIG. 10 is a circuit diagram of a control circuit 500 in the fourth embodiment of the invention.

FIG. 10 is a circuit diagram of a control circuit 500 in the fourth embodiment of the invention. This embodiment is a combination of the second and third embodiments. The instant embodiment can provide both effects of the second and third embodiments.

The timing shift circuit TS may be replaced by the delay circuit TD. In this case, both effects of the first and second embodiments can be obtained.

Figure 11:
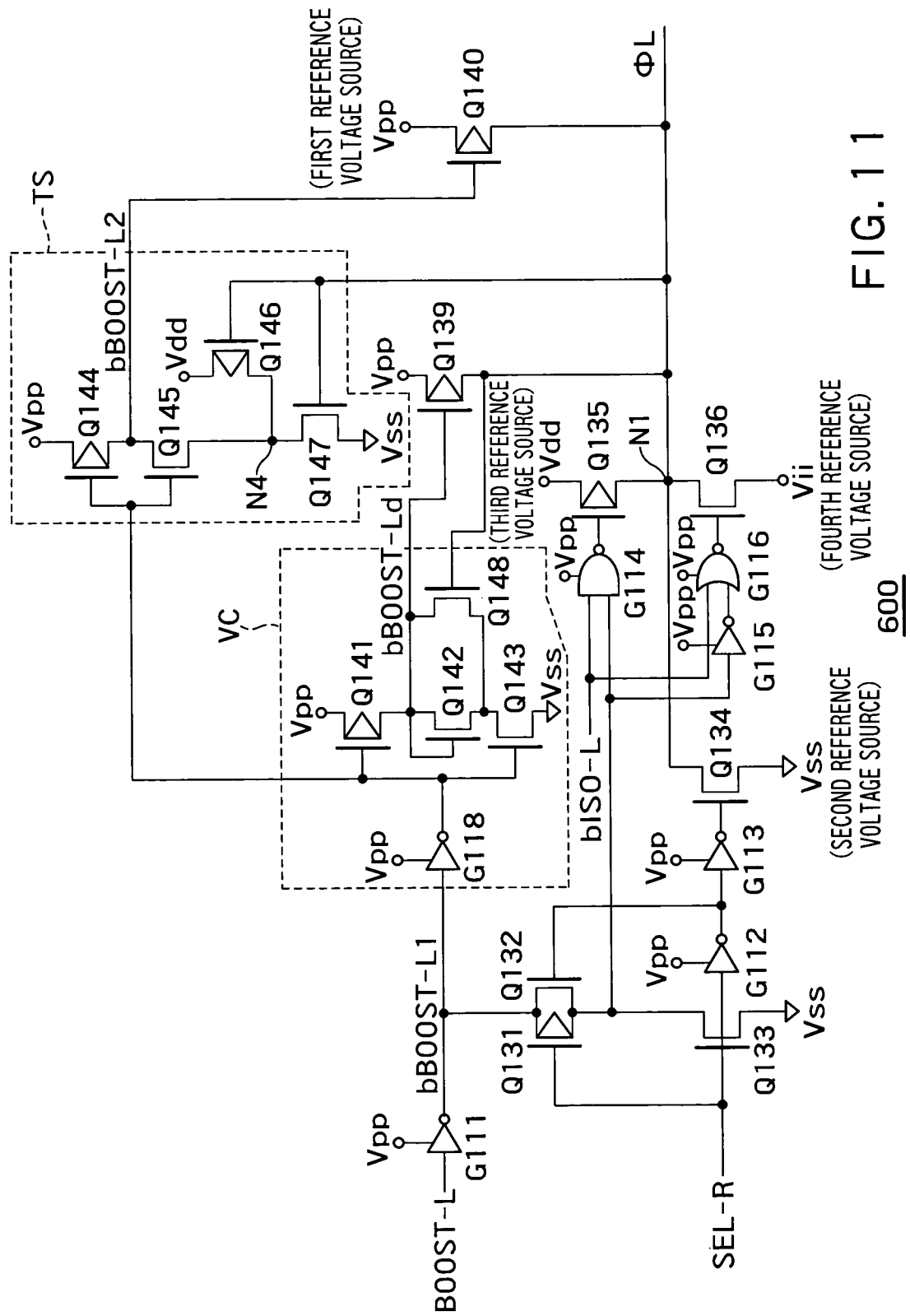
FIG. 11 is a circuit diagram of a control circuit 600 in the fifth embodiment of the invention.

FIG. 11 is a circuit diagram of a control circuit 600 in the fifth embodiment of the invention. This embodiment is different from the fourth embodiment in the use of an N-channel transistor Q148 inside the voltage control circuit VC. The transistor Q148 is connected in parallel with the transistor 142. The gate of the transistor Q148 is connected to the gates of the transistor Q109 and Q110. To operate the transistor Q139 at an earlier timing than the transistor Q140, the threshold voltage of the transistor Q148 is preferably lower than the threshold voltage of the transistor 147.

Figure 12:
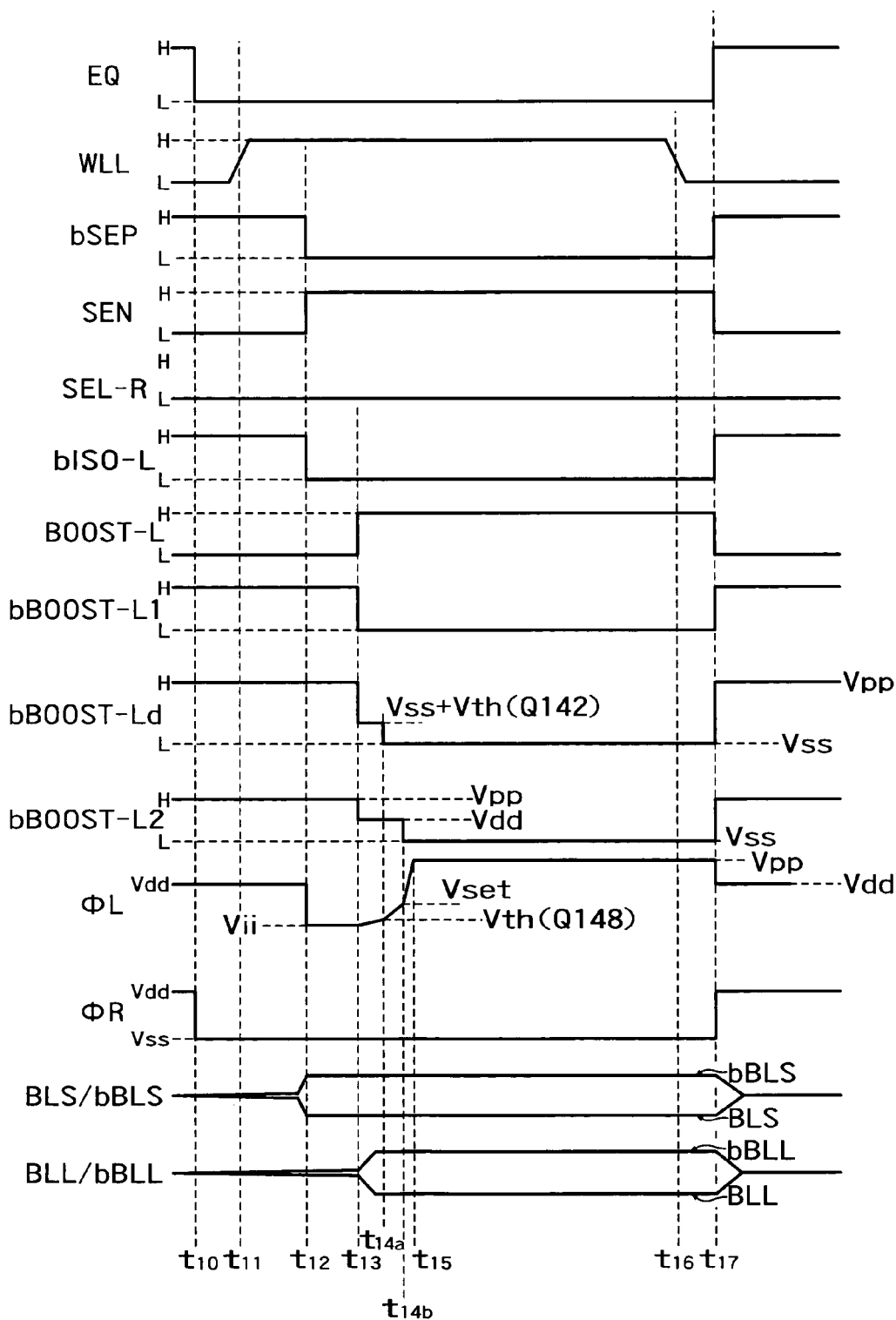
FIG. 12 is a timing chart showing operations according to the fifth embodiment of the invention.

FIG. 12 is a timing chart showing operations according to the fifth embodiment of the invention. The fourth embodiment has been explained as the control signal ΦL rising from Vii to Vpp while changing its inclination twice. In the instant embodiment, however, the control signal ΦL rises from Vii to Vpp while changing its inclination three times.

Operations of the fifth embodiment from the time $t_{10}$ to the time $t_{13}$ are identical to those of the second embodiment. At the time $t_{13}$, since the voltage of the boost signal bBOOST-Ld is lowered from Vpp to Vss+Vth(Q142), the transistor Q139 switches ON. Therefore, inclination of the control signal ΦL from the time $t_{13}$ to the time $t_{14a}$ in the instant embodiment (called the first inclination hereunder) is identical to the inclination of the control signal ΦL from the time $t_{13}$ to the time $t_{14}$ in the second embodiment (see FIG. 7).

Since the control signal ΦL is fed back to the gate of the transistor Q148, the transistor Q148 turns ON when the voltage of the control signal ΦL rises to the threshold value Vth(Q148) of the transistor Q148(time $t_{14a}$). Since the gate voltage of the transistor Q139 becomes Vss responsively, the channel resistance of the transistor Q139 further decreases, and the driving power of the transistor Q139 is enhanced. As a result, the control signal ΦL rises with a second inclination larger than the first inclination.

Further, when the voltage of the control signal ΦL rises from Vii and reaches the set voltage Vset, the transistor Q146 is switched OFF, and the transistor Q147 is switched ON (time $t_{14b}$). Accordingly, the voltage of the control signal ΦL rises up to Vpp with a third inclination larger than the second inclination. The third inclination is identical to the inclination of the control signal ΦL from the time $t_{14}$ to the time $t_{15}$ in the third embodiment (see FIG. 9). Operations of the instant embodiment after arrival of the voltage of the control signal ΦL to Vpp, that is, operations as from the time $t_{15}$, are identical to those of the third embodiment.

The control circuit 600 changes the inclination of the control signal in three steps. The second inclination of the control signal ΦL is larger than the first inclination and smaller than the third inclination. Therefore, the control circuit 600 can raise the voltage of the control signal ΦL from Vii to Vpp relatively smoothly. In other words, upon amplification of data, the instant embodiment can connect the bit line pair BLL/bBLL shown in FIG. 2 to the bit line pair BLS/bBLS more smoothly that the first to fourth embodiments. As a result, the sense amplifier of this embodiment can perform its amplifying operation with less noise and higher sensitivity than the first to fourth embodiments. The instant embodiment can additionally obtain the same effects as those of the fourth embodiment.

Figure 13:
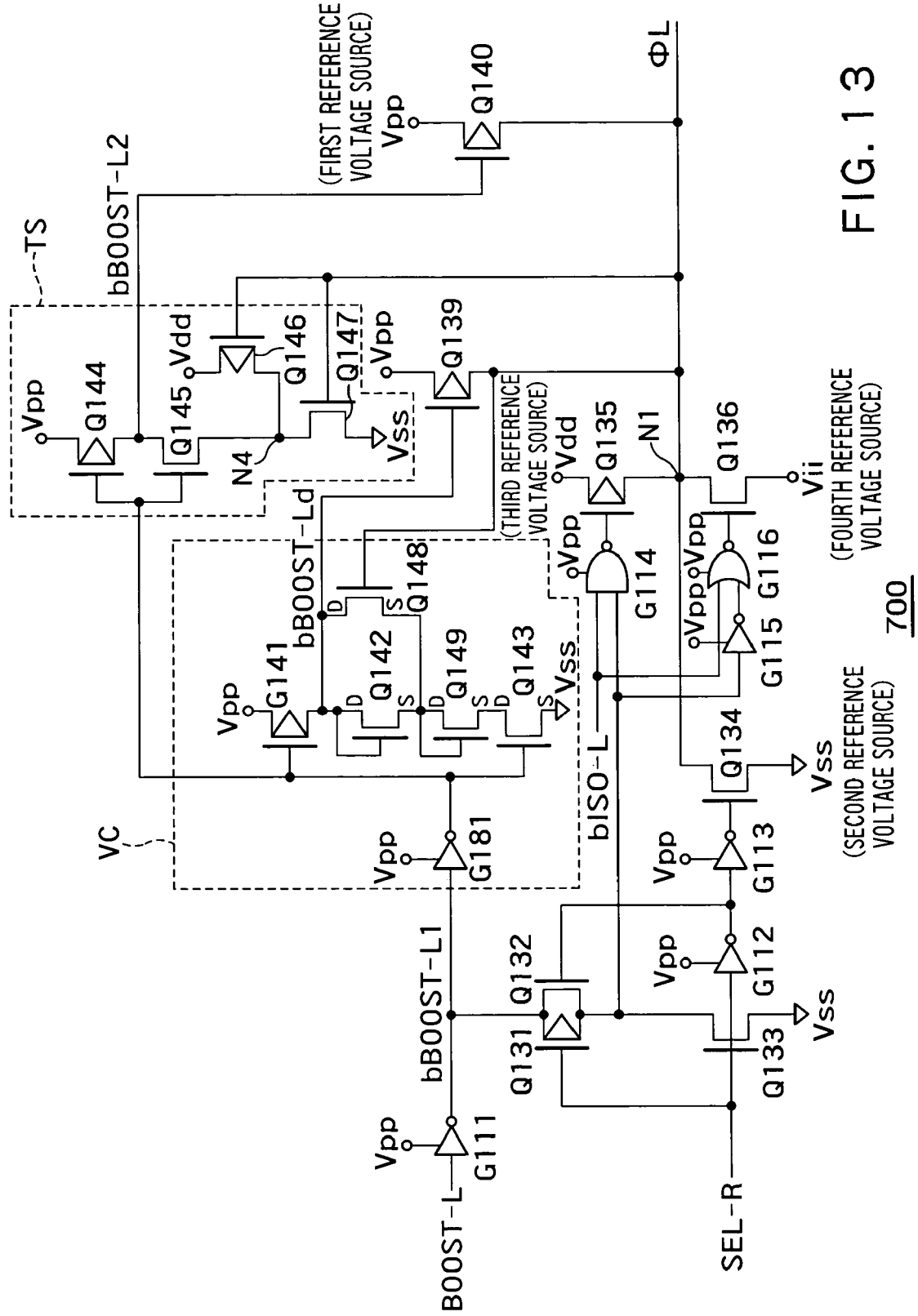
FIG. 13 is a circuit diagram of a control circuit 700 in the sixth embodiment of the invention.

FIG. 13 is a circuit diagram of a control circuit 700 in the sixth embodiment of the invention. This embodiment is different from the fifth embodiment in the use of an N-channel transistor Q149 inside the voltage control circuit VC. The transistor Q149 is connected between the transistors Q142 and Q143. The gate of the transistor Q149 is connected to the drain of the transistor Q149 and the source of the transistor Q148.

Figure 14:
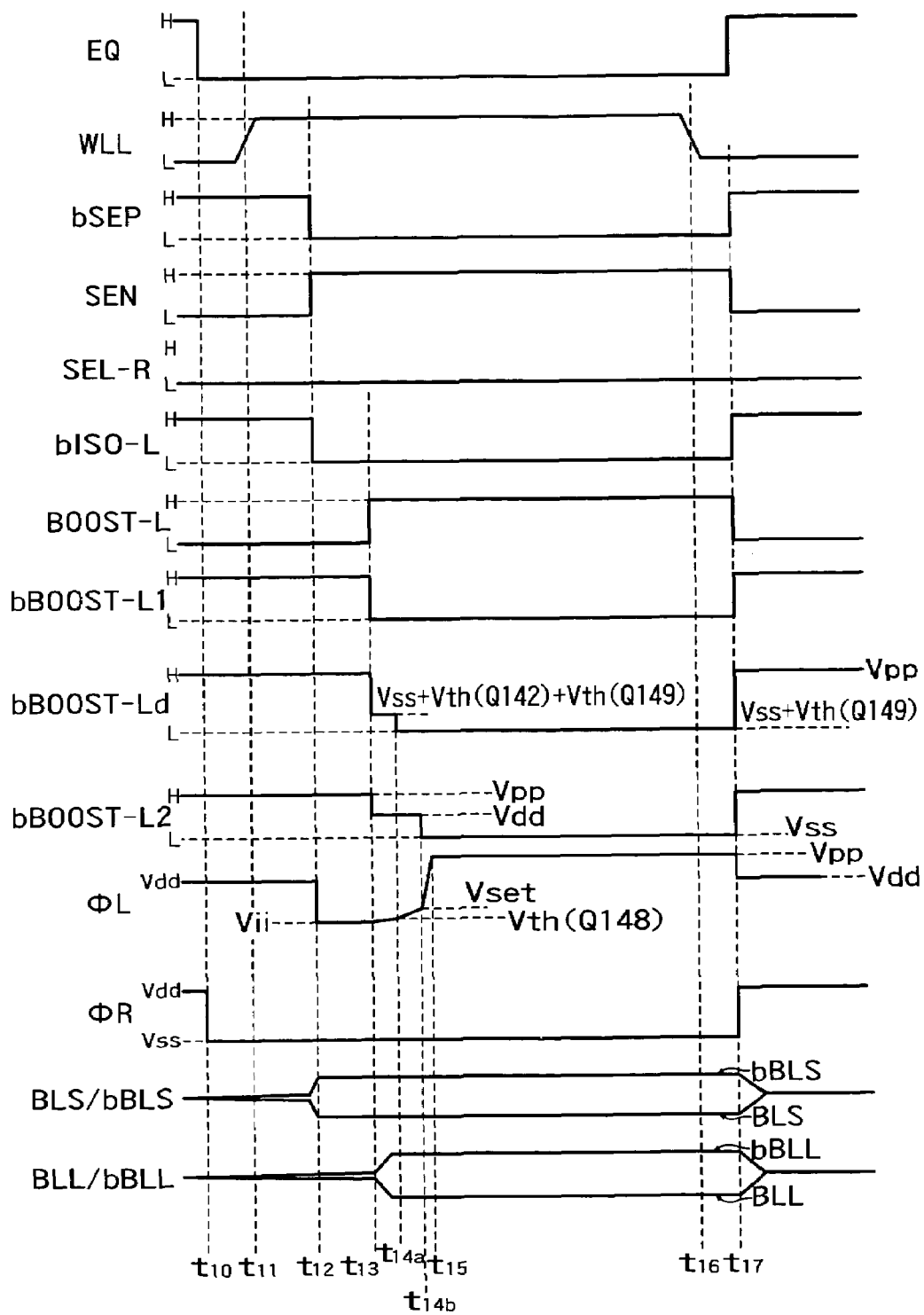
FIG. 14 is a timing chart showing operations according to the sixth embodiment of the invention.

FIG. 14 is a timing chart showing operations according to the sixth embodiment of the invention. This embodiment is similar to the fifth embodiment in that the control signal ΦL rises from Vii to Vpp while changing its inclination three times.

In the instant embodiment, however, the transistor Q149 is interposed between the source of the transistor Q148 and the second reference voltage source. Therefore, at the time $t_{13}$, the voltage of the boost signal bBOOST-Ld is reduced from Vpp to Vss+Vth(Q142)+Vth(Q149). Thus, the first inclination of the control signal ΦL in the instant embodiment is smaller than the first inclination of the control signal ΦL in the fifth embodiment.

At the time $t_{14a}$, the voltage of the boost signal bBOOST-Ld is further reduced from Vss+Vth(Q142)+Vth(Q149) to Vss+Vth(Q149). Therefore, the second inclination of the control signal ΦL in the instant embodiment is smaller than the second inclination of the control signal ΦL in the fifth embodiment. Operations of the instant embodiment as from the time $t_{14b}$ are identical to those of the fifth embodiment. Vth(Q142) and Vth(Q149) can be set independently for adjusting the gate voltage of the transistor Q139, i.e. for adjusting the inclination of the control signal ΦL.

According to the instant embodiment, since the first and second inclinations of the control signal ΦL are smaller than those of the first embodiment, the control circuit 700 can raise the voltage of the control signal ΦL smoothly from Vii to Vpp. In other words, upon amplification of data, the instant embodiment can connect the bit line pair BLL/bBLL shown in FIG. 2 to the bit line pair BLS/bBLS more smoothly than the first to fifth embodiments. As a result, the sense amplifier in this embodiment can perform its amplifying operation with less noise and higher sensitivity than the first to fifth embodiments. Furthermore, the instant embodiment can obtain the same effects as those of the fifth embodiment.

A control circuit (not shown) connecting the source of the transistor Q148 to the source of the transistor Q149 will be also acceptable as a modification of the control circuit 700 shown in FIG. 13. In this modification, the voltage of the boost signal bBOOST-Ld changes from Vss+Vth(Q142)+Vth(Q149) to Vss at the time $t_{14a}$ shown in FIG. 14. Therefore, the first inclination of the control signal ΦL is as small as that of the sixth embodiment, and the second inclination of the control signal ΦL is equal to that of the third embodiment.

The numbers of the transistors Q142 and Q149 connected in series between the transistor Q139 and the second reference voltage source are not limitative. For example, when assuming that the numbers of the transistors Q142 and Q149 are m and n, respectively, the voltage of the boost signal bBOOST-Ld from the time $t_{13}$ to the time $t_{14a}$ is Vss+m*Vth(Q142)+n*Vth(Q149). The voltage of the boost signal bBOOST-Ld from the time $t_{14a}$ to the time $t_{17}$ is Vss+n*Vth(Q149).

Figure 15:
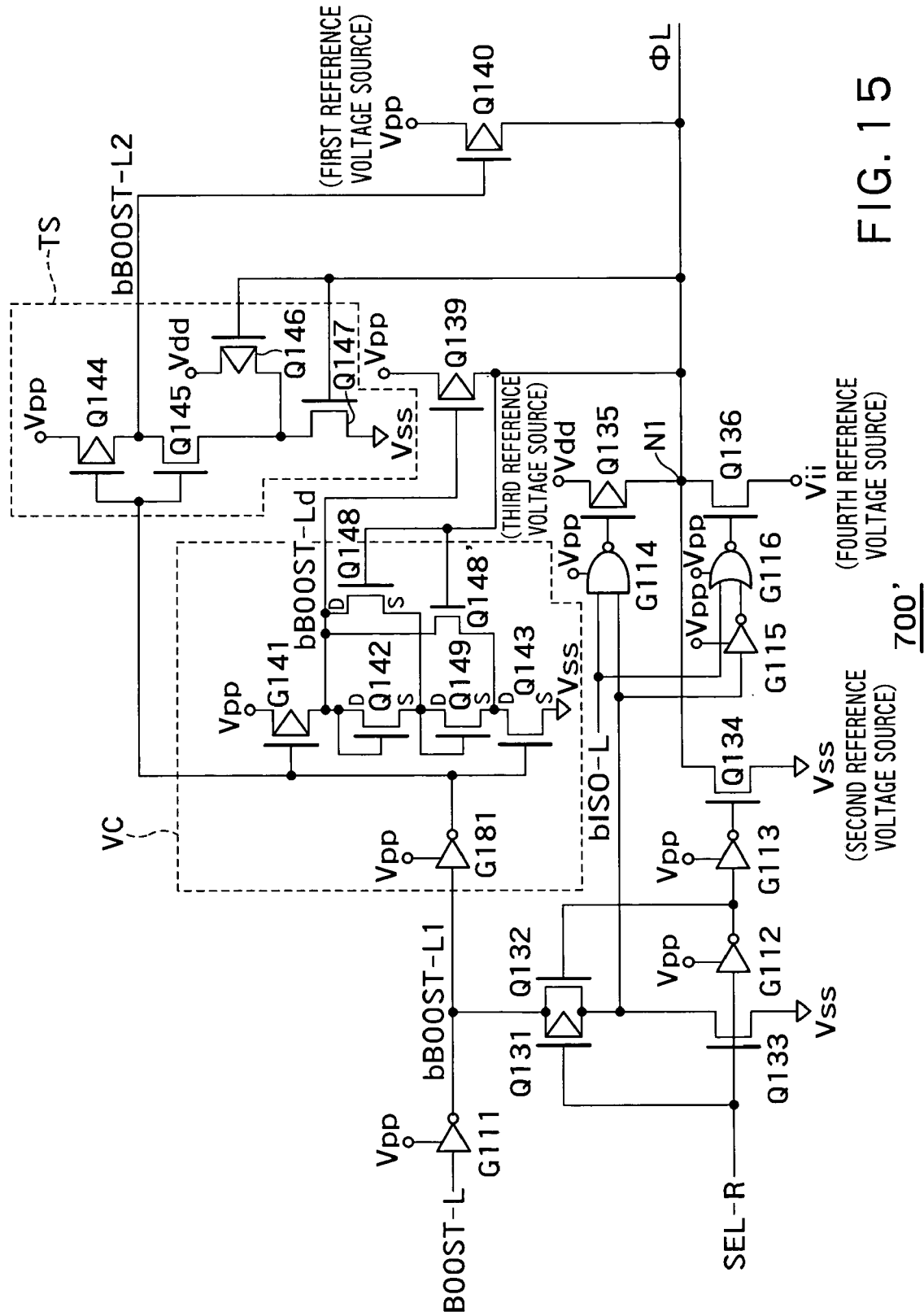
FIG. 15 is a circuit diagram as a modification of the sixth embodiment of the invention.

The number of the transistor Q148 is not limitative either. As shown in FIG. 15 for example, a transistor Q148' is connected in parallel to the transistors Q142 and Q149. The transistor Q148' shares a common gate with the transistor Q148. Further, Vth(Q148') is higher than Vth(Q148). This modification can raise the control signal ΦL from Vii to Vpp while changing the inclination four times. If the number of transistor Q148 is further increased, it will be possible to raise the control signal ΦL from Vii to Vpp while changing its inclination five or more times.

Figure 16:
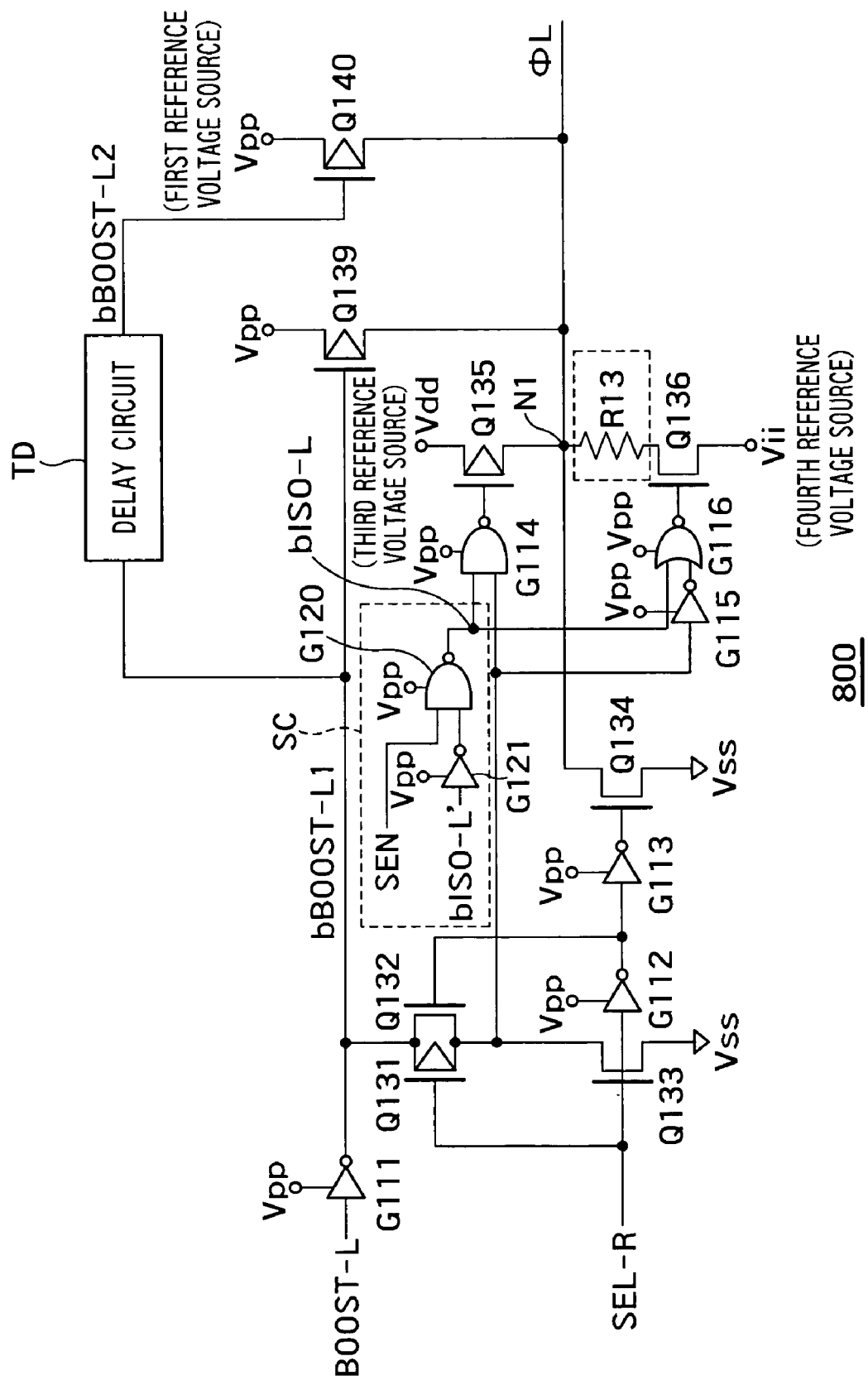
FIG. 16 is a circuit diagram of a control circuit 800 in the seventh embodiment of the invention.

FIG. 16 is a circuit diagram of a control circuit 800 in the seventh embodiment of the invention. This embodiment is different from the first embodiment in the use of a sync circuit SC and a resistor R13.

The sync circuit SC is connected to the input of the NAND gate G114 and the input of the NOR gate G116. The sync circuit SC includes a NAND gate 120. The NAND gate 120 introduces a sense amplifier activation signal SEN (see FIG. 2) and the inverted signal of the isolating signal bISO-L', and outputs its result of its arithmetical operation to the NAND gate G114.

The control circuit 800 having the sync circuit SC can actuate the transistors Q109 and Q110 (see FIG. 2) in synchronism with the sense amplifier activation signal SEN. Responsively, the bit line pair BLS/bBLS is isolated from the bit line pair BLL/bBLL substantially concurrently with activation of the sense amplifier.

If the sense amplifier 116 is activated under the condition where the bit line pair BLS/bBLS is fully isolated from the bit line pair BLL/bBLL like the conventional circuit, then the data is more likely to be influenced by noise caused by the capacitance difference between the bit lines BLS+BLL and bBLS+bBLL, and this may result in inverting the data when the sense amplifier is activated.

In the instant embodiment, however, since the bit line pair BLS/bBLS is isolated from the bit line pair BLL/bBLL substantially at the same time as activation of the sense amplifier 116, data is less likely to be influenced by noise caused by the capacitance difference between the bit line BLS+BLL and bBLS+bBLL.

The control circuit 800 further includes a resistor R13 connected in series between the transistor Q136 and the node N1. The resistor R13 and a parasitic capacitance constitute an RC delay circuit. Further, the voltage of the control signal ΦL in above-mentioned embodiments transit slowly. As a result, when the sense amplifier 116 is activated, the bit line pair BLS/bBLS is gradually isolated from the bit line pair BLL/bBLL. Therefore, the sense amplifier 116 is less likely to detect the noise caused by the capacitance difference between the bit lines BLS+BLL and bBLS+bBLL. As a result, the sense amplifier 116 can amplify the correct data. The instant embodiment additionally has the same effects as those of the first embodiment. The parasitic capacitance may be, for example, the wiring capacitance between the resistor R13 to the gates of the transistor Q109 and Q110.

Figure 17:
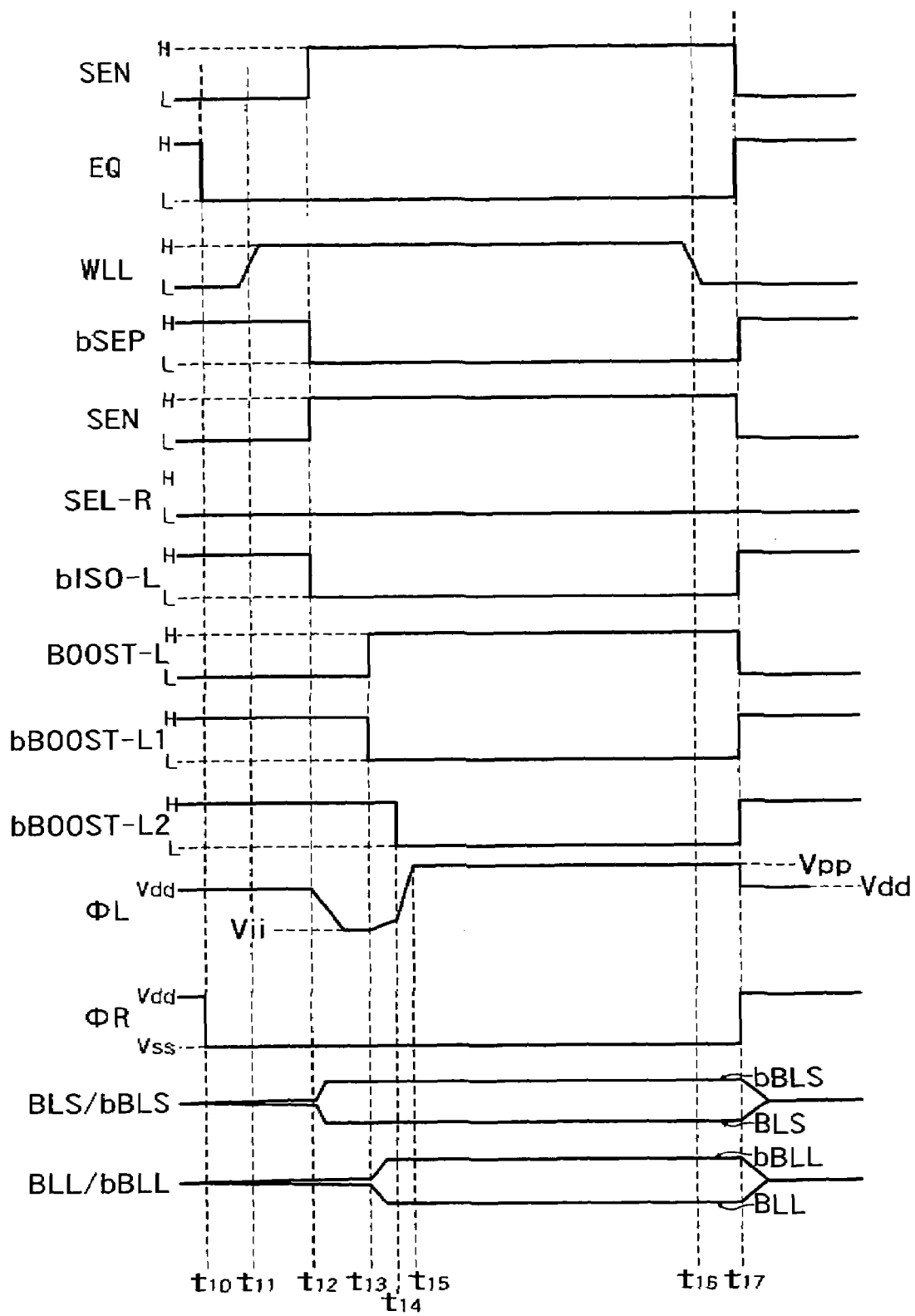
FIG. 17 is a timing chart showing operations according to the seventh embodiment of the invention.

FIG. 17 is a timing chart showing operations according to the eighth embodiment of the invention. At the time $t_{12}$ where the sense amplifier activation signal SEN changes from LOW to HIGH, the voltage of the control signal ΦL begins to decrease. This demonstrates that the control circuit 800 synchronizes with the sense amplifier 116. At that time, ISO-L' is maintained LOW.

In the period from the time $t_{12}$ to the time $t_{13}$, the control signal ΦL gradually decreases from Vdd to Vii. This demonstrates that the bit line pair BLS/bBLS is gradually isolated from the bit line pair BLL/bBLL. The other operations of this embodiment are identical to those of the first embodiment.

Figure 18:
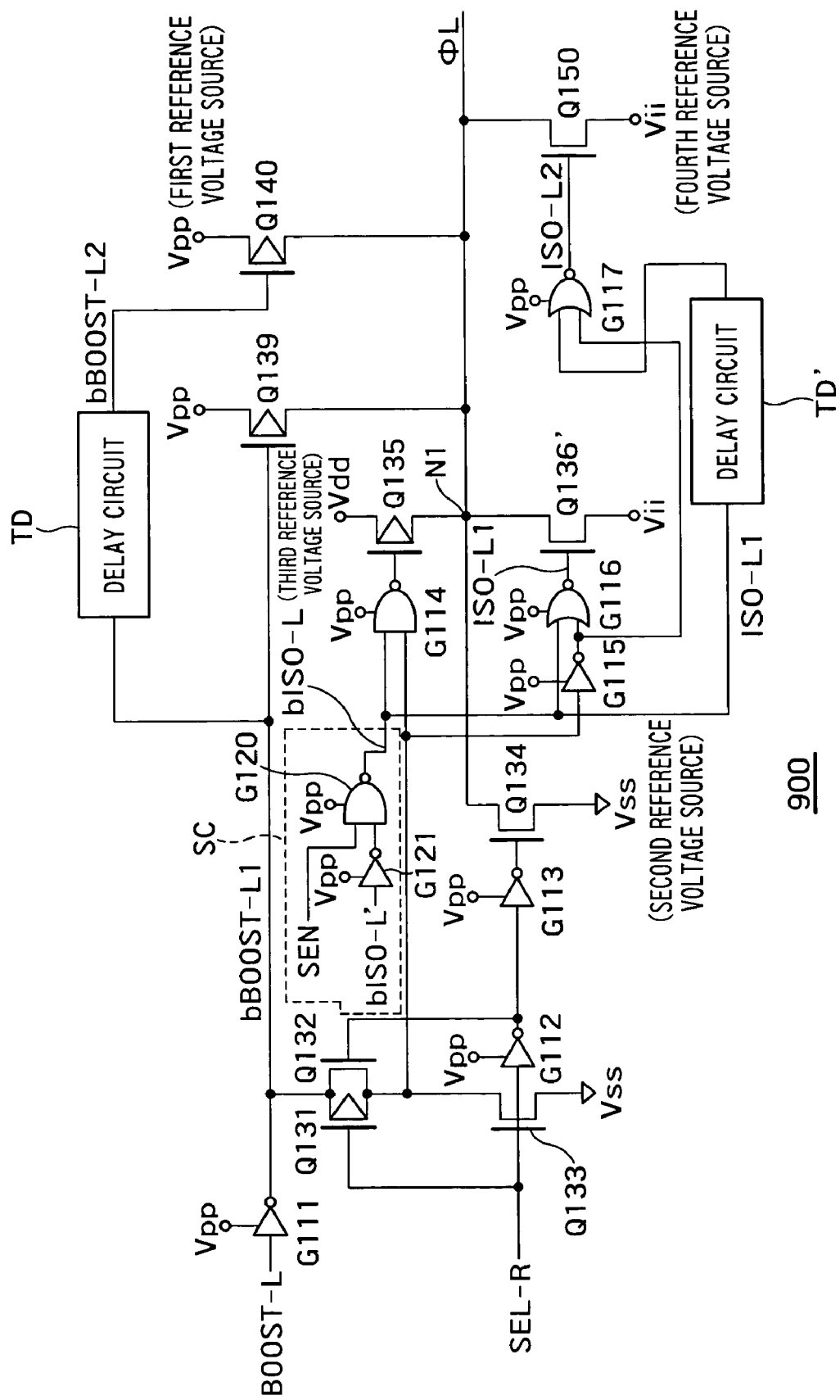
FIG. 18 is a circuit diagram of a control circuit 900 in the eighth embodiment of the invention.

FIG. 18 is a circuit diagram of a control circuit 900 in the eighth embodiment of the invention. This embodiment is different from the first embodiment in the use of a delay circuit TD' NOR gate G117 and N-channel transistor Q150. In addition, this embodiment is different from the first embodiment in that the transistor Q136' is smaller in size than the transistor Q136.

The transistor Q150 is connected in series between the second reference voltage source and the node N1. The NOR gate G117 introduces the same signal as that introduced into the NOR gate G116. The NOR gate G117, however, introduces the isolating signal bISO-L through the delay circuit TD'. The output of the NOR gate G117 is connected to the gate of the transistor Q150. Accordingly, the transistor Q150 operates after a delay from the transistor Q136'. Configuration of the delay circuit TD' may be identical to the configuration of the delay circuit TD. The NOR gate G117 is used for the purpose of delaying the operation of the transistor Q150 than the operation of the transistor Q136' and preventing that the transistor Q139 turns ON earlier than the transistor Q150 is switched OFF.

The control circuit 900 includes the sync circuit SC similarly to the control circuit 800. Thus, the control circuit 900 can activate the transistors Q109 and Q110 in synchronism with the sense amplifier activation signal SEN.

Figure 19:
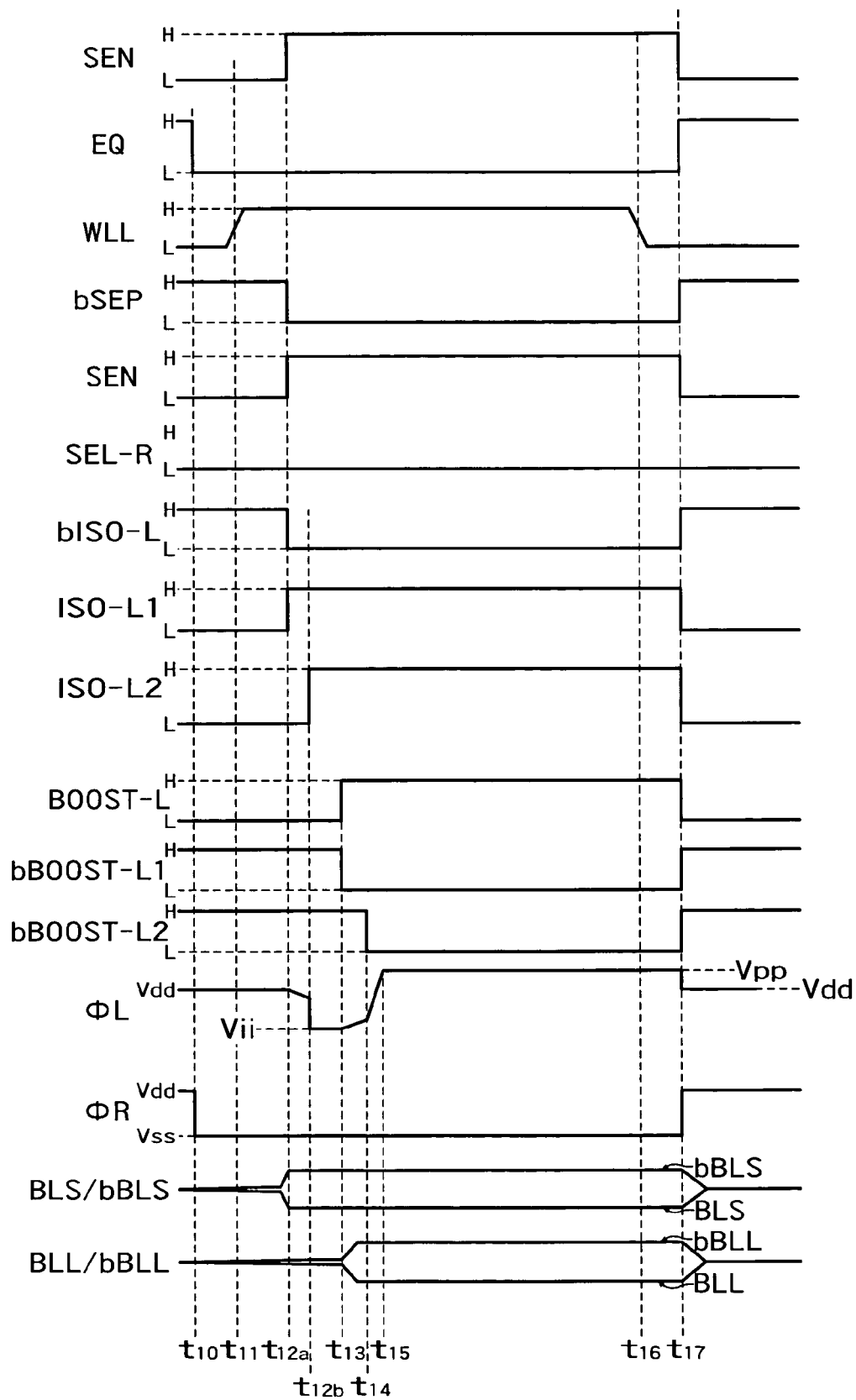
FIG. 19 is a timing chart showing operations according to the eighth embodiment of the invention.

FIG. 19 is a timing chart showing operations according to the eighth embodiment of the invention. At the time $t_{12a}$, since the isolating signal ISO-L1 changes from LOW to HIGH, the transistor Q136' turns ON. Responsively, the voltage of the control signal ΦL gradually decreases from Vdd. Since the transistor Q136' has a relatively small size, the voltage of the control signal ΦL in this embodiment begins to decrease more slowly than the seventh embodiment.

At the time $t_{12b}$, since the isolating signal ISO-L2 changes from LOW to HIGH, the transistor Q150 turns ON later than the transistor Q136'. Thereby, the voltage of the control signal rapidly decreases toward Vii.

In the instant embodiment, isolation of the bit line pair BLS/bBLS and the bit line pair BLL/bBLL occurs after activation of the sense amplifier 116. Therefore, this embodiment can reliably exclude noise caused by the capacitance difference between the bit lines BLS+BLL and bBLS+bBLL. Additionally, the instant embodiment has the same advantages as those of the seventh embodiment.

The signs "S" and "D" shown at individual transistors in the drawings denote their sources and drains.

In the fourth to sixth embodiments, the timing shift circuit TS may be replaced by the RC delay circuit TD. In the seventh and eighth embodiments, the RC delay circuit may be replaced by the timing shift circuit TS.

Figure 20:
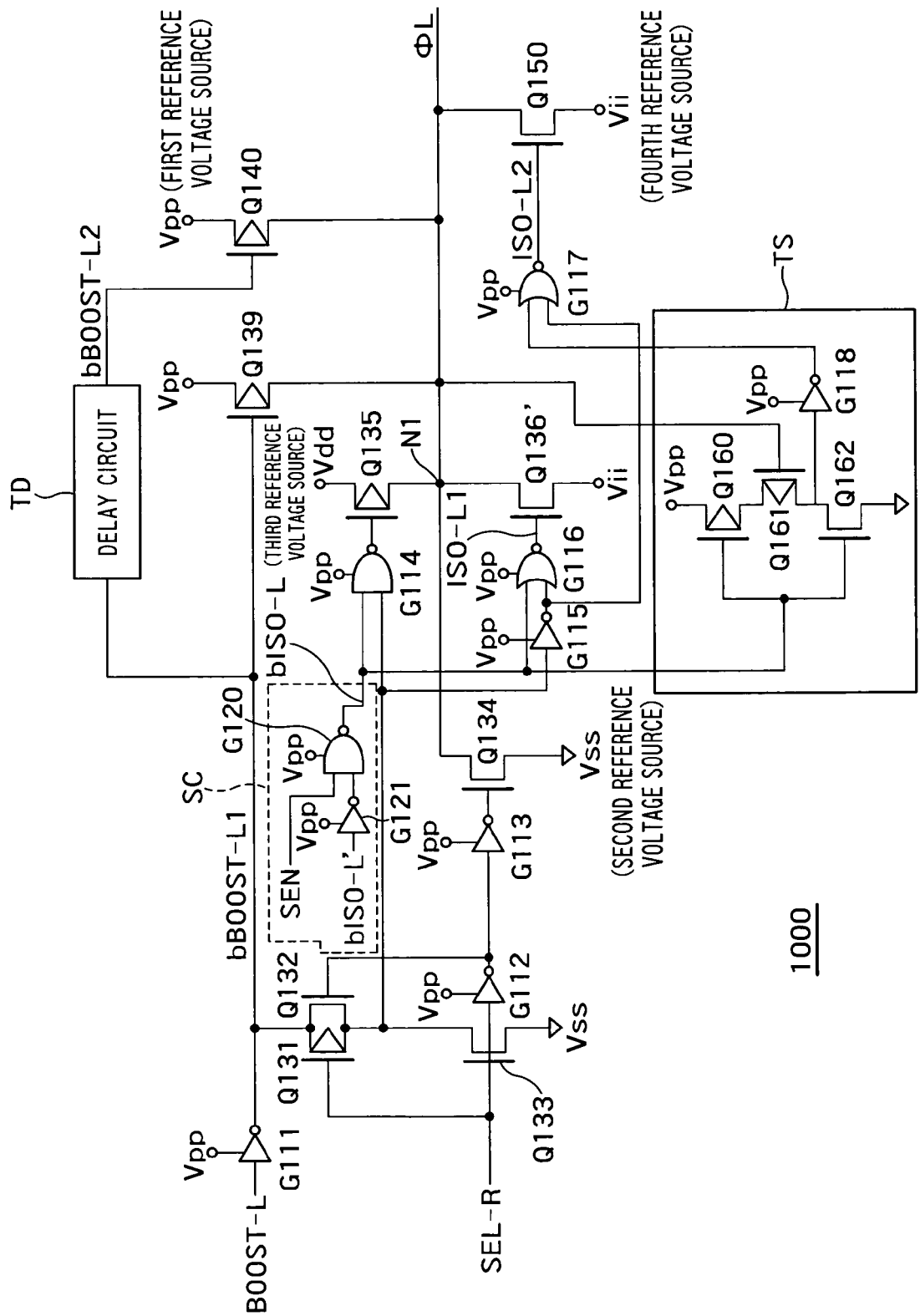
FIG. 20 is a circuit diagram of a control circuit 1000 in the ninth embodiment of the invention.
Figure 21:
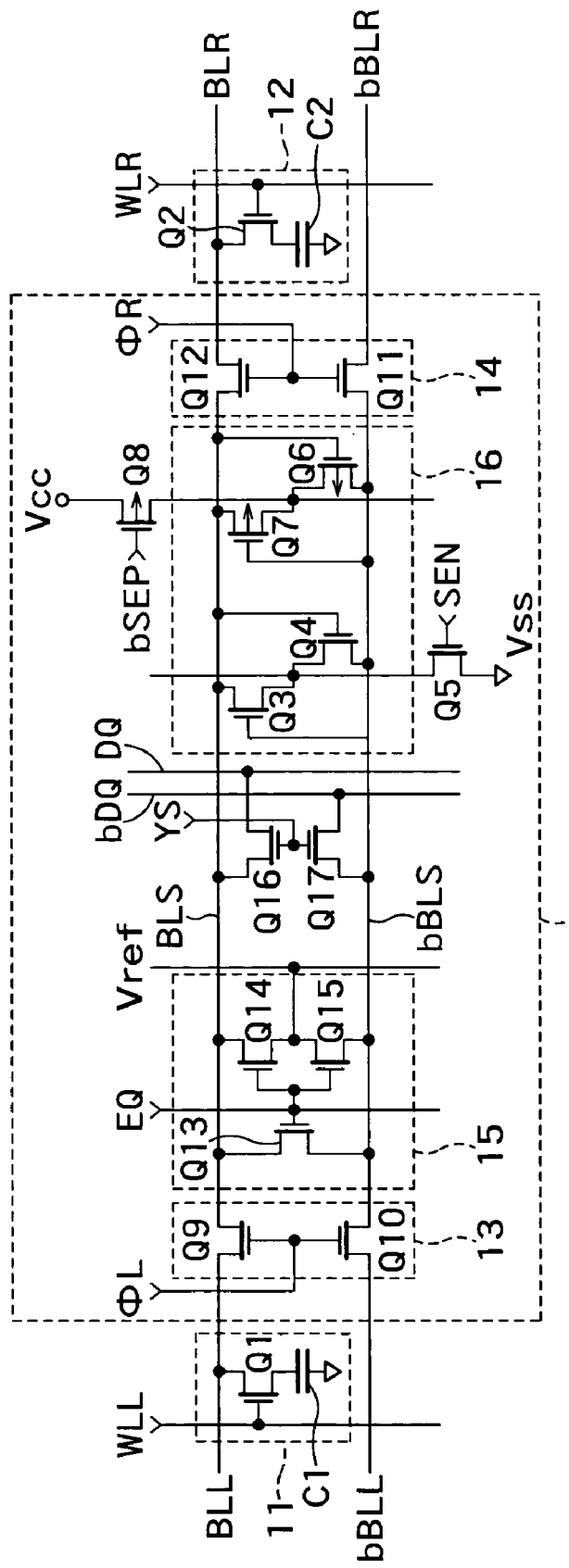
FIG. 21 is a circuit diagram of an amplifier circuit 10 equipped in a conventional semiconductor storage device.

FIG. 20 is a circuit diagram of a control circuit 1000 in the ninth embodiment of the invention. This embodiment uses the timing shift circuit TS in lieu of the RC delay circuit TD used in the eighth embodiment. The timing chart of this embodiment appears identical to that of FIG. 19. The embodiment shown in FIG. 20 also ensures the same effects as those of the eighth embodiment.

The seventh and eighth embodiments may additionally include a voltage change circuit (VC) between the gate of the transistor Q139 and the inverter G111. Although the foregoing embodiments are directed to DRAM-type semiconductor storage devices, the invention is not limitative to those embodiments, but it is applicable to other storage devices.

The semiconductor storage devices heretofore explained can amplify data quickly, and can prevent noise caused by the capacitance difference of bit lines during amplification of data.

What is claimed is:

1. A semiconductor storage device comprising:
   a memory cell array including memory cells and bit lines for transfer of data in the memory cells;
   an amplifier circuit connected to the bit lines to amplify data in the memory cells;
   a first switching element connected between the bit lines and the amplifier circuit;
   a first reference voltage source which applies to a gate of the first switching element a voltage for controlling the first switching element;
   a second switching element and a third switching element connected between the gate of the first switching element and the first reference voltage source, said second switching element and said third switching element being connected in parallel to each other;
   a second reference voltage source which applies to a gates of the second and third switching elements a voltage for controlling the second and third switching elements;
   a first timing shift circuit connected between the gate of the third switching element and the gate of the second switching element to delay the operation of the third switching element from the operation of the second switching element; and
   a feedback circuit to return to the gate voltage at the gate of the first switching element back to the first timing shift circuit,
   wherein the first timing shift circuit connects the second reference voltage source to the gate of the third switching element when the gate voltage exceeds a given set voltage.

2. The semiconductor storage device according to claim 1, wherein the second and third switching elements are P-channel transistors,
   wherein the second and third switching elements turn OFF when the gates thereof are connected to the first reference voltage source, and
   wherein the second and third switching elements turn ON when the gates thereof are connected to the second reference voltage source.

3. The semiconductor storage device according to claim 1, wherein the first timing shift circuit includes:
   a third reference voltage source having a voltage between the voltage of the first reference voltage source and the voltage of the second reference voltage source;
   a fourth switching element connected between the gate of the third switching element and the third reference voltage source, said fourth switching element having a gate connected to the gate of the first switching element; and
   a fifth switching element connected between the gate of the third switching element and the second reference voltage source, said fifth switching element having a gate connected to the gate of the first switching element and being opposite in conduction type from the fourth switching element,
   wherein the set voltage is based upon the difference between the voltage of the third reference voltage source and the threshold voltage of the fourth switching element.

4. The semiconductor storage device according to claim 3, further comprising:
   a voltage control circuit interposed between the gate of the second switching element and the second reference voltage source to adjust the voltage from the second reference voltage source.

5. The semiconductor storage device according to claim 4, wherein the voltage control circuit includes:
   a sixth switching element interposed between the gate of the second switching element and the second reference voltage source, said sixth switching element having the gate and the drain connected to the gate of the second switching element.

6. The semiconductor storage device according to claim 5, wherein the voltage control circuit includes:
   a seventh switching element connected between the source of the sixth switching element and the gate of the second switching element in parallel with the sixth switching element, said seventh switching element having a gate connected to the gate of the first switching element.

7. The semiconductor storage device according to claim 6, wherein the voltage control circuit further includes:
   an eighth switching element interposed between the sixth switching element and the second reference voltage source, said eighth switching element having a gate and a drain connected to the source of the sixth switching element and a source connected to the second reference voltage source.

8. The semiconductor storage device according to claim 7, wherein the voltage control circuit is connected between the source of the eighth switching element and the gate of the second switching element in parallel to the sixth and eighth switching elements, said voltage control circuit having a gate connected to the gate of the first switching element.

9. The semiconductor storage device according to claim 8, wherein the voltage control circuit includes a ninth switching element having a threshold value higher than that of the seventh switching element.

10. The semiconductor storage device according to claim 1, further comprising:
a voltage control circuit interposed between the gate of the second switching element and the second reference voltage source to adjust the voltage from the second reference voltage source.

11. The semiconductor storage device according to claim 1, further comprising:
a third reference voltage source having a voltage between the voltage of the first reference voltage source and the voltage of the second reference voltage source;
a fourth reference voltage source having a voltage between the voltage of the second reference voltage source and the voltage of the third reference voltage source;
a tenth switching element connected between the third reference voltage source and the gate of the first switching element;
an eleventh switching element connected between the fourth reference voltage source and the gate of the first switching element; and
a resistor connected between the eleventh switching element and the gate of the first switching element,
wherein the eleventh switching element is OFF when the tenth switching element is ON and the eleventh switching element is ON when the tenth switching element is OFF.

12. The semiconductor storage device according to claim 11, wherein operations of the tenth switching element and the eleventh switching element are synchronized with a signal which activates the amplifier circuit.

13. The semiconductor storage device according to claim 1, further comprising:
a third reference voltage source having a voltage between the voltage of the first reference voltage source and the voltage of the second reference voltage source;
a fourth reference voltage source having a voltage between the voltage of the second reference voltage source and the voltage of the third reference voltage source;
a tenth switching element connected between the third reference voltage source and the gate of the first switching element;
an eleventh switching element connected between the fourth reference voltage source and the gate of the first switching element;
a twelfth switching element connected in parallel to the eleventh switching element between the fourth reference voltage source and the gate of the first switching element; and
a second timing shift circuit to delay the operation of the twelfth switching element from the operation of the eleventh switching element.

14. The semiconductor storage device according to claim 13, wherein the second timing shift circuit is an RC delay circuit composed of a second resistor and a second capacitor.

15. The semiconductor storage device according to claim 13, further comprising a feedback circuit to return the gate voltage at the gate of the first switching element back to the second timing shift circuit,
wherein the second timing shift circuit connects the second reference voltage source to the gate of the third switching element when the gate voltage exceeds a given set voltage.

16. The semiconductor storage device according to claim 13, wherein a channel width of the eleventh switching element is narrower than that of the twelfth switching element.

17. A semiconductor storage device comprising:
a memory cell array including memory cells, and bit lines for transfer of data in the memory cells;
an amplifier circuit connected to the bit lines to amplify data in the memory cells;
a first switching element connected between the bit lines and the amplifier circuit;
a first reference voltage source which applies to the gate of the first switching element a voltage for controlling the first switching element;
a second switching element and a third switching element connected between the gate of the first switching element and the first reference voltage source, said second switching element and said third switching element being connected in parallel to each other;
a second reference voltage source which applies to the gates of the second and third switching elements a voltage for controlling the second and third switching elements; and
a first timing shift circuit connected between the sate of the third switching element and the gate of the second switching element to delay the operation of the third switching element from the operation of the second switching element,
wherein a channel width of the second switching element is narrower than that of the third switching element.

* * * * *